(12) United States Patent
Okumura

(10) Patent No.: US 10,686,066 B2
(45) Date of Patent: *Jun. 16, 2020

(54) SEMICONDUCTOR DEVICE AND METHOD OF MANUFACTURING SAME

(71) Applicant: Fuji Electric Co., Ltd., Kanagawa (JP)

(72) Inventor: Keiji Okumura, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/169,868

(22) Filed: Oct. 24, 2018

(65) Prior Publication Data
US 2019/0140093 A1   May 9, 2019

(30) Foreign Application Priority Data

Nov. 9, 2017   (JP) .................................. 2017-216568

(51) Int. Cl.
*H01L 29/78* (2006.01)
*H01L 29/16* (2006.01)
(Continued)

(52) U.S. Cl.
CPC .... *H01L 29/7813* (2013.01); *H01L 21/02378* (2013.01); *H01L 21/048* (2013.01);
(Continued)

(58) Field of Classification Search
CPC ........... H01L 21/02378; H01L 21/0465; H01L 21/048; H01L 23/544; H01L 29/045; H01L 29/0623; H01L 29/0696; H01L 29/0865; H01L 29/0878; H01L 29/0882; H01L 29/1095; H01L 29/1608; H01L 29/36; H01L 29/4236; H01L 29/517; H01L 29/518; H01L 29/66068; H01L 29/66734; H01L 29/7397; H01L 29/7813
See application file for complete search history.

(56) References Cited

U.S. PATENT DOCUMENTS 8,598,652 B2 * 12/2013 Takaya ................ H01L 29/0623
                                                        257/331
2008/0230787 A1 * 9/2008 Suzuki ................ H01L 29/0623
                                                        257/77
(Continued)

FOREIGN PATENT DOCUMENTS

JP       2013-219161 A     10/2013

*Primary Examiner* — Joseph M Galvin, III
(74) *Attorney, Agent, or Firm* — Chen Yoshimura LLP

(57) ABSTRACT

This semiconductor device includes: an n-type SiC drift layer; a p-type base region; an n-type source region selectively embedded in the top part of the base region; p-type base contact regions selectively embedded in the top part of the base region so as to form a first gap with the source region along the <11-20> direction; a gate electrode provided via a gate insulating film; and an n-type drain region. The top surface of the drain region has an off-angle relative to the <11-20> direction towards the <0001> direction, and an alignment mark for positioning is formed on the top surface. The drift layer and the base region are epitaxially grown films, and a width wg of the first gap is set in accordance with a positional deviation width of the alignment mark caused by the off-angle and epitaxial growth.

20 Claims, 31 Drawing Sheets

(51) Int. Cl.
  *H01L 29/08* (2006.01)
  *H01L 29/10* (2006.01)
  *H01L 29/423* (2006.01)
  *H01L 29/66* (2006.01)
  *H01L 21/02* (2006.01)
  *H01L 21/04* (2006.01)
  *H01L 23/544* (2006.01)
  *H01L 29/51* (2006.01)

(52) U.S. Cl.
  CPC ........ *H01L 21/0465* (2013.01); *H01L 23/544* (2013.01); *H01L 29/0865* (2013.01); *H01L 29/0882* (2013.01); *H01L 29/1095* (2013.01); *H01L 29/1608* (2013.01); *H01L 29/4236* (2013.01); *H01L 29/517* (2013.01); *H01L 29/66068* (2013.01); *H01L 29/66734* (2013.01); *H01L 2223/54426* (2013.01)

(56) References Cited

U.S. PATENT DOCUMENTS

| | | | |
|---|---|---|---|
| 2017/0170288 A1* | 6/2017 | Kiyosawa | H01L 21/3247 |
| 2017/0221714 A1* | 8/2017 | Wakimoto | H01L 29/66734 |
| 2018/0350976 A1* | 12/2018 | Okumura | H01L 29/7813 |

* cited by examiner

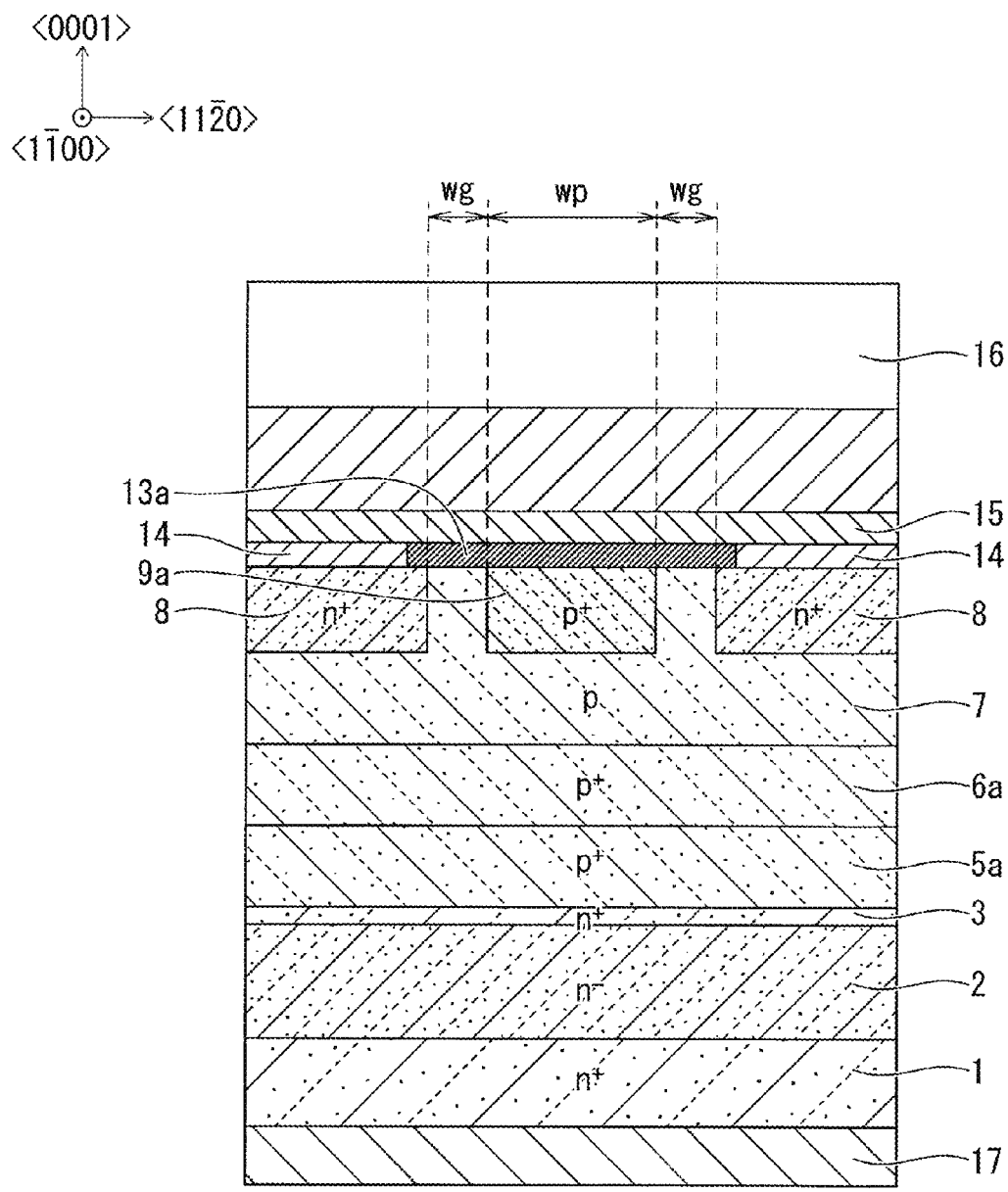
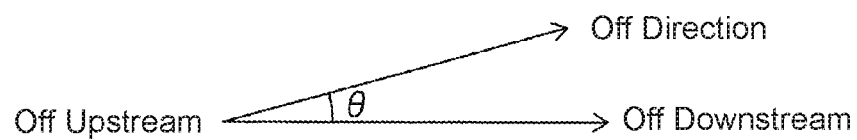
FIG. 3

SEMICONDUCTOR DEVICE AND METHOD OF MANUFACTURING SAME

BACKGROUND OF THE INVENTION

Technical Field

The present invention relates to a semiconductor device and a method of manufacturing the same.

Background Art

A photolithography process is used in the manufacturing processes of a semiconductor device, such as a field effect transistor (MOSFET) having silicon carbide (SiC) as the material thereof. In the photolithography process, alignment during the fabrication of various types of semiconductor layers on the semiconductor substrate is important, and in many cases, the alignment method is to read an alignment mark formed on the semiconductor substrate by etching or the like.

In the reading of the alignment mark, a region of a prescribed shape containing the alignment mark is normally imaged on the semiconductor substrate, and the image data from the imaging is analyzed by a reading device on the basis of a prescribed technique such as luminance analysis. The analysis determines the position of the alignment mark, and position information about the determined alignment mark is input to a positioning device of the semiconductor substrate. The input position information is combined with design data of the semiconductor substrate, thereby determining the ion implantation position or trench digging position, etc. for subsequent processes.

When epitaxial growth is performed on the base semiconductor substrate (or on an epitaxial layer formed on the base SiC substrate), the shape of the alignment mark that is initially dug into the top surface of the SiC semiconductor substrate (or on the epitaxial layer formed on the SiC semiconductor substrate) is also transferred to the top surface of the epitaxially grown film deposited on the semiconductor substrate. In addition, if the top surface of the semiconductor substrate (or the epitaxial layer on the SiC semiconductor substrate) has an off-angle, the epitaxial growth will cause the initial alignment mark to be transferred in a manner whereby the pattern collapses in the off-angle direction. Due to this, the position of the transferred top side alignment mark will deviate from the position of the bottom side initial alignment mark by a certain width in the direction parallel to the main surface of the semiconductor substrate.

If a plurality of such positional deviations of the alignment mark occur due to the off-angle and epitaxial growth, then the positions of the alignment marks imaged from above the semiconductor substrate perpendicular to the top surface of the semiconductor substrate will appear to doubly or triply overlap itself. Thus, during a plurality of rounds of the reading operation of the same semiconductor substrate, the alignment mark selected by the reading device may not always be the same, and there may be a case in which different alignment marks are selected. If different alignment marks are selected in consecutive photolithography processes, there is a risk that a positional deviation (a so-called "lithography deviation") could occur among the semiconductor layers to be fabricated.

Patent Document 1, for example, discloses a semiconductor device in which a base contact region is formed in an opening in the center of a source region. When consecutively fabricating this type of source region and base contact region with photolithography processes, if the n-type impurity ion implantation region that will serve as the source region and the p-type impurity ion implantation region that will serve as the base contact region overlap each other, then the conductivity types will cancel each other out in the overlapped region. In particular, if the source region and base contact region undergo ion implantation with approximately the same impurity density, then in the region where the implanted ions overlap, the contact performance of the base contact region will cease to be sufficient. Due to this, the contact resistance increases, and the ON resistance Ron and forward voltage Vf of the body diode increases, which results in defects, i.e., variation in forward voltage Vf and ON resistance Ron.

In order to avoid such defects, a method is conceivable in which reading errors of the alignment mark are prevented by forming an alignment mark on the top surface of the semiconductor layer positioned on the topmost of the semiconductor substrate each time epitaxial growth is performed and then using the alignment mark for the reading. However, the number of photolithography processes would increase in order to form the large number of alignment marks, thus increasing manufacturing burdens.

Another method is conceivable in which a separate reading device is disposed at the bottom surface side of the semiconductor substrate and the alignment mark is read separately from above and below, thereby avoiding interference of the shape of the alignment mark transferred to the top side in order to read the initial alignment mark on the bottom side. However, the reading devices in already-existing manufacturing facilities are overwhelmingly a type that images the position of the alignment mark from the top surface side of the semiconductor substrate, and thus, in the case of a method that additionally installs a separate reading device, new capital investment would be needed, thus increasing costs.

RELATED ART DOCUMENT

Patent Document

Patent Document 1: Japanese Patent Application Laid-Open Publication No. 2013-219161

SUMMARY OF THE INVENTION

Accordingly, the present invention is directed to a scheme that substantially obviates one or more of the problems due to limitations and disadvantages of the related art. In view of the aforementioned problems, the present invention aims at providing a semiconductor device that is capable of stabilizing and reducing variation in forward voltage Vf and ON resistance Ron even if a reading error of an alignment mark occurs, and a method of manufacturing such semiconductor device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a planar substrate made of silicon carbide single crystal, a <1-100> direction of the silicon carbide single crystal being in parallel with a plane of a top surface of the substrate, a <11-20> direction of the silicon carbide single crystal being offset by a non-zero off-angle θ relative to the plane of the top surface of the substrate, the substrate being of a first conductive type so as to serve as a lower electrode contact region for the semiconductor device; a drift layer made of silicon carbide single crystal of the first conductivity type, formed on the top surface of the substrate; a base region made of silicon carbide single crystal of a second conductivity type formed over the drift layer; an upper electrode contact region of the first conductivity type with a higher impurity density than the drift layer, selectively embedded in an upper part of the base region, the upper electrode contact region defining an opening in which the upper part of the base region remains in a plan view; a base contact region of the second conductivity type with a higher impurity density than the base region, selectively embedded in the opening of the upper electrode contact region in the upper part of the base region, the base contact region being formed in either one of the following manners: a) gaps are formed between the base contact region and respective edges, on both sides along the <11-20> direction, of the opening of the upper electrode contact region in the plan view, or b) a gap is formed between the base contact region and an edge, on only one side along the <11-20> direction, of the opening of the upper electrode contact region in the plan view, and a non-contact region is embedded in the upper part of the base region continuously from the base contact region in the opening on another side of the opening; and a gate electrode provided via a gate insulating film contacting the base region located between the upper electrode contact region and the drift layer, wherein at least one of the drift layer and the base region is epitaxially gown over the substrate, and a top surface of the upper part of the base region has an alignment mark that is transferred from a lower alignment mark formed in a top surface of a layer located below the base region, the alignment mark in the top surface of the base region having a positional deviation Δx relative to the lower alignment mark formed along the <11-20> direction in the plan view, and wherein in case of (a), a width, along the <11-20> direction, of a larger one of the gaps is greater than Δx, and in case of (b), a width, along the <11-20> direction, of the opening is greater than Δx, and a sum of a width, along the <11-20> direction, of the non-contact region and a width, along the <11-20> direction, of the base contact region is greater than Δx.

In another aspect, the present disclosure provides a method of manufacturing a semiconductor device, the method including: preparing a semiconductor substrate made of silicon carbide single crystal, a <1-100> direction of the silicon carbide single crystal being in parallel with a plane of the top surface of the substrate, a <11-20> direction of the silicon carbide single crystal being offset by a non-zero off-angle θ relative to the plane of the top surface of the substrate, the substrate being of a first conductive type so as to serve as a lower electrode contact region for the semiconductor device; forming a drift layer made of silicon carbide single crystal of the first conductivity type on the semiconductor substrate; forming a base region made of silicon carbide single crystal of a second conductivity type over the drift layer; selectively forming, in an upper part of the base region, a first doped region that will become an upper electrode contact region of the semiconductor device by implanting impurity ions of the first conductivity type with a higher impurity density than an impurity density of the drift layer such that the first doped region defines an opening that leaves the upper part of the base region not implanted with the impurity ions; forming, on the first doped region, an ion implantation mask having an opening that exposes a surface of the opening of the first doped region in the upper part of the base region such that respective edges of the opening of the ion implantation mask along the <11-20> direction in a plan view protrude laterally and inwardly beyond respective inner edges of the opening of the first doped region, thereby covering the respective inner edges of the opening of the first doped region; forming a second doped region that will become a base contact region by implanting impurity ions of the second conductivity type in the upper part of the base region through the ion implantation mask; activating the first doped region to form the upper electrode contact region having an opening corresponding to the opening of the first doped region; activating the second doped region to form the base contact region, the resulting base contact region being thereby formed in the opening of the upper electrode contact region; forming a gate insulating film contacting the base region located between the upper electrode contact region and the drift layer; and forming a gate electrode on a surface of the gate insulating film, wherein at least one of the drift layer and the base region is formed by epitaxial growth, and the method further includes forming a lower alignment mark in a top surface of a layer that is located below the base layer and estimating a maximum alignment error, along the <11-20> direction, in positioning the ion implantation mask on the first doped region, the estimating of the maximum alignment error including estimating a lateral positional deviation Δx, along the <11-20> direction, of an alignment mark formed in a top surface of the base region that is transferred from the lower alignment mark, and wherein in the forming of the ion implantation mask, a width of an opening of the ion implantation mask along the <11-20> direction is set such that the resulting base contact region is always formed within the opening of the resulting upper electrode contact region along the <11-20> direction even when the estimated maximum alignment error is realized in positioning the ion implantation mask on the first doped region along the <11-20> direction.

In another aspect, the present disclosure provides a method of manufacturing a semiconductor device, the method including: preparing a semiconductor substrate made of silicon carbide single crystal, a <1-100> direction of the silicon carbide single crystal being in parallel with a plane of the top surface of the substrate, a <11-20> direction of the silicon carbide single crystal being offset by a non-zero off-angle θ relative to the plane of the top surface of the substrate, the substrate being of a first conductive type so as to serve as a lower electrode contact region for the semiconductor device; forming a drift layer made of silicon carbide single crystal of the first conductivity type on the semiconductor substrate; forming a base region made of silicon carbide single crystal of a second conductivity type over the drift layer; selectively forming, in an upper part of the base region, a first doped region that will become an upper electrode contact region of the semiconductor device by implanting impurity ions of the first conductivity type with a higher impurity density than an impurity density of the drift layer such that the first doped region defines an opening that leaves the upper part of the base region not implanted with the impurity ions; forming an ion implantation mask on the first doped region, the ion implantation mask having an opening that has a same width as a width of the opening in the first doped region along the <11-20> direction; forming a second doped region that will become a base contact region by implanting impurity ions of the second conductivity type in the upper part of the base region through the ion implantation mask; activating the first doped region to form the upper electrode contact region; activating the second doped region to form the base contact region; forming a gate insulating film contacting the base region located between the upper electrode contact region and the drift layer; and forming a gate electrode on a surface of the gate insulating film, wherein at least one of the drift layer and the base region is formed by epitaxial growth, and the method further includes forming a lower alignment mark in a top surface of a layer located under the base region and estimating a maximum alignment error, along the <11-20> direction, in positioning the ion implantation mask on the first doped region, the estimating of the maximum alignment error including estimating a lateral positional deviation $\Delta x$, along the <11-20> direction, of an alignment mark formed in a top surface of the base region that is transferred from the lower alignment mark, and wherein in the forming of the first doped region, a width of the opening of the first doped region along the <11-20> direction is set such that a width of a corresponding opening of the resulting upper electrode contact region along the <11-20> direction is greater than the estimated maximum alignment error so that the base contact region is formed in at least a portion of the opening of the upper electrode contact region even when the estimated maximum alignment error is realized in positioning the ion implantation mask on the first doped region along the <11-20> direction.

The estimated maximum alignment error may be $\Delta x$ that is estimated by $\Delta x = t \times \tan \theta$, where t is a sum of thicknesses of all of epitaxially grown layers between the lower alignment mark and the alignment mark in the top surface of the base region.

Also, the maximum alignment error may be estimated by $\Delta x + d$, where $\Delta x$ is estimated by $\Delta x = t \times \tan \theta$, t being a sum of thicknesses of all of epitaxially grown layers between the lower alignment mark and the alignment mark in the top surface of the base region, and d represents a statistically derived positional deviation due to an alignment error by a positioning device that positions the semiconductor device in photolithography.

The present invention makes it possible to provide a semiconductor device that is capable of stabilizing and reducing variation in forward voltage Vf and ON resistance Ron even if a reading error of an alignment mark occurs, and a method of manufacturing such semiconductor device.

It is to be understood that both the foregoing general description and the following detailed description are exemplary and explanatory, and are intended to provide further explanation of the invention as claimed.

BRIEF DESCRIPTION OF THE DRAWINGS

FIG. 3 is a cross-sectional view of main components as seen from a direction along the B-B line in FIG. 2.

DETAILED DESCRIPTION OF EMBODIMENTS

Figure 1:
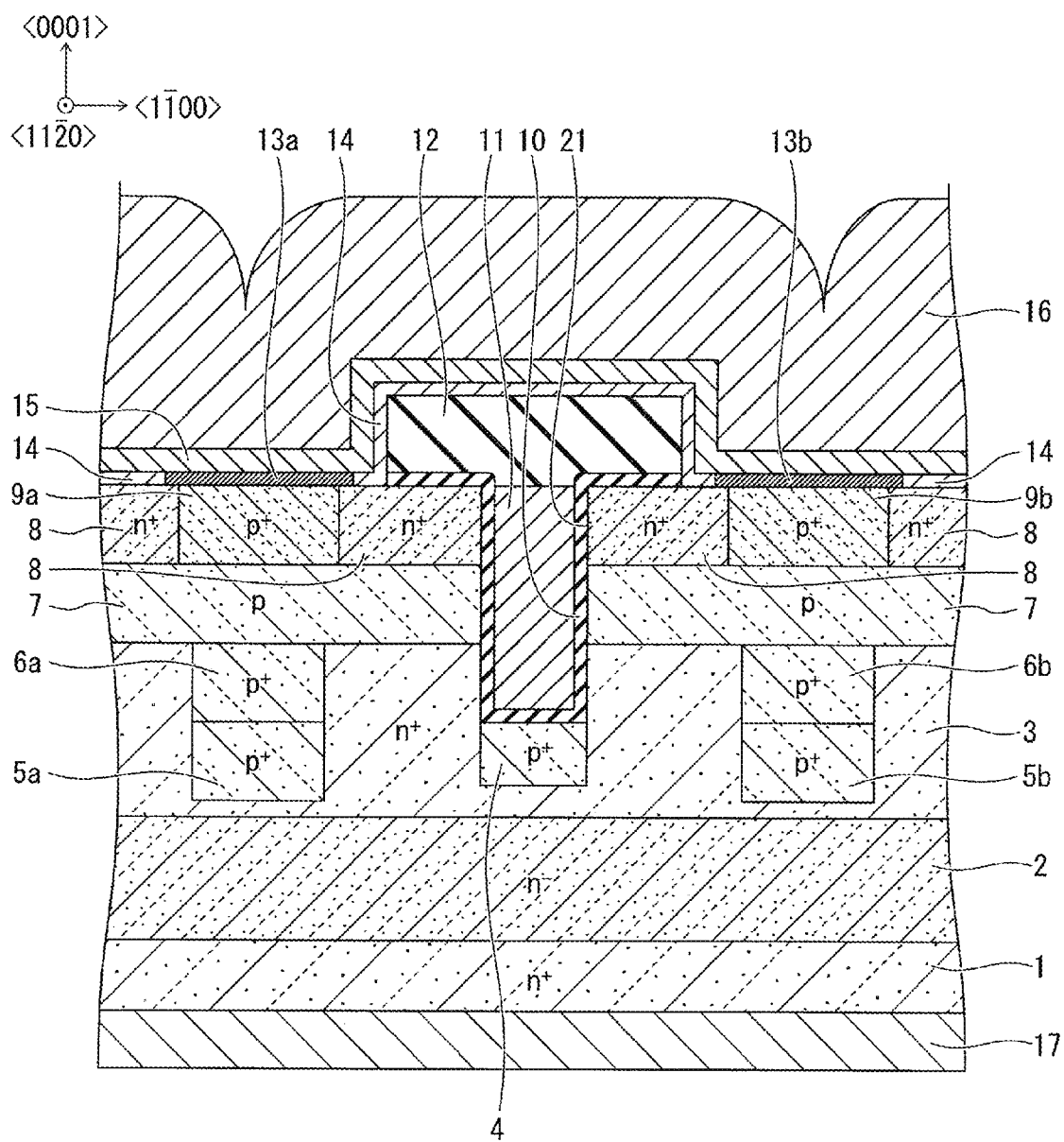
FIG. 1 is a cross-sectional view of main components, as seen from a direction along the A-A line in FIG. 2, that schematically shows an overview of the structure of a semiconductor device according to Embodiment 1.

Embodiments 1 and 2 of the present invention will be described below with reference to the drawings. In the description below, portions in the drawings that are the same or similar will be assigned the same or similar reference characters. However, it should be noted that the drawings are schematic, and that the relation between the thickness and planar dimensions and the ratio of thicknesses of the respective layers differ in practice. Thus, specific thicknesses and dimensions should be determined in reference to the description below. Furthermore, there are naturally portions that differ in dimensional relations and ratios between the drawings.

In the present specification, the "first main electrode region" means a semiconductor region serving as either a source region or a drain region in an insulated gate FET (MISFET), an insulated gate static induction transistor (MISSIT), or the like. In an insulated gate bipolar transistor (IGBT), "first main electrode region" means a semiconductor region serving as either an emitter region or a collector region. In a MIS gate static inductor thyristor (MIS gate SI thyristor), "first main electrode region" means a semiconductor region serving as either an anode region or a cathode region.

The "second main electrode region" means, in a MISFET or MISSIT etc., a semiconductor region serving as whichever of the source region or drain region that is not the first main electrode region. In an IGBT, "second main electrode region" means a region serving as whichever of the emitter region or collector region that is not the first main electrode region. In a MIS gate SI thyristor, "second main electrode region" means a region serving as whichever of the anode region or cathode region that is not the first main electrode region. In other words, if the "first main electrode region" is the source region, then "second main electrode region" means the drain region. If the "first main electrode region" is the emitter region, then "second main electrode region" means the collector region. If the "first main electrode region" is the anode region, then "second main electrode region" means the cathode region.

In the description of the embodiments below, the first conductivity type is illustratively described as n-type and the second conductivity type as p-type, but the conductivity types may be reversed, where the first conductivity type is p-type and the second conductivity type is n-type. In the present specification and the attached drawings, "+" or "−" attached to an "n" or "p" signifies a semiconductor region in which the impurity density is higher or lower, respectively, than a semiconductor region not having the "+" or "−". Moreover, in the description below, even if it not explicitly limited as such, it is both technically and logically obvious that members or regions to which the limitation of "first conductivity type" and "second conductivity type" have been added signify members or regions made of a semiconductor material. Furthermore, when representing Miller indices in the present specification, "−" signifies a bar attached to the index immediately thereafter, and attaching a "−" before the index represents a negative index.

Furthermore, in the description below, the definition of "top" and "bottom" such as in "top surface" and "bottom surface" are merely expressions for the shown cross-sectional views, and if the orientation of the semiconductor device were changed 90°, then "top" and "bottom" would be called "left" and "right," and if changed 180°, "top" and "bottom" would be reversed and called "bottom" and "top," for example.

<Structure of Semiconductor Device>

As shown in FIG. 1, the semiconductor device according to Embodiment 1 of the present invention is a trench gate MOSFET that includes a drift layer 2 of a first conductivity type ($n^-$ type) and a base region 7 of a second conductivity type (p-type) disposed on the top surface side of the drift layer 2. The top part of the base region 7 is provided with an $n^+$ first main electrode region (source region) 8 of a higher impurity density than the drift layer 2. A trench 21 is provided going through the source region 8 and base region 7, and the bottom surface and side surfaces of the trench 21 are provided with a gate insulating film 10.

A gate embedded electrode 11 is embedded inside the trench 21 via a gate insulating film 10 provided so as to contact the base region 7. The semiconductor device according to Embodiment 1 is a MOSFET, and thus an $n^+$ second main electrode region (drain region) 1 is disposed on the bottom surface side of the drift layer 2. For convenience, in FIG. 1 a single cell structure containing one of the trenches 21 is shown as a main component cross section, but a larger current can be passed by arraying a plurality of this single cell structure at prescribed intervals to form a multi-channel structure.

The upper part of the base region 7 is provided with $p^+$ base contact regions 9a, 9b of a higher impurity density than the base region 7 so as to contact the source region 8. The upper part of the drift layer 2 has formed therein an $n^+$ current spreading layer (CSL) 3 of a higher impurity density than the drift layer 2 so as to be interposed between the lower part of the drift layer 2 and the base region 7. The current spreading layer 3 is provided by introducing n-type impurities into the top of the drift layer 2, and functions to reduce spreading resistance of the carrier. The current spreading layer 3 need not be provided, and instead the top surface of the drift layer 2 may contact the base region 7 at the position where the top surface of the current spreading layer 3 would be.

In order to protect the gate insulating film 10 on the bottom of the trench 21 from high voltages during reverse bias, the bottom of the trench 21 has a p$^+$ gate bottom protection region 4 disposed thereon. Meanwhile, the bottom surface side of the base region 7 below the base contact regions 9a, 9b has p$^+$ base bottom embedded regions (5a, 6a), (5b, 6b) disposed thereon. The cross-sectional shape of the base bottom embedded regions (5a, 6a), (5b, 6b) is substantially rectangular.

The base bottom embedded region (5a, 6a) includes a pattern having, as a unit, a rectangle containing a first embedded region 5a made of a first rectangle, and a second embedded region 6a made of a second rectangle disposed on the top surface of the first embedded region 5a and contacting the bottom surface of the base region 7. The base bottom embedded region (5b, 6b) includes a pattern having, as a unit, a rectangle containing a first embedded region 5b made of a first rectangle, and a second embedded region 6b made of a second rectangle disposed on the top surface of the first embedded region 5b and contacting the bottom surface of the base region 7. The top surfaces of the first embedded regions 5a, 5b are provided at the same depth as the top surface of the gate bottom protection region 4.

The drain region 1 is formed of a semiconductor substrate made of SiC (SiC substrate), and the drift layer 2 is formed of an epitaxial layer made of SiC (SiC layer). In addition to SiC, the drain region 1 and drift layer 2 can be various types of semiconductor material with a bandgap wider than the 1.1 eV bandgap of silicon, such as gallium nitride (GaN), diamond, or aluminum nitride (AlN).

It has been reported that the bandgap at room temperature is 2.23 eV for 3C—SiC, 3.26 eV for 4H—SiC, 3.02 eV for 6H—SiC, 3.4 eV for GaN, 5.5 eV for diamond, and 6.2 eV for AlN. A wide bandgap semiconductor with a bandgap of 2.0 eV or greater can be used for the drain region 1, drift layer 2, and the like, but for LEDs etc. a "wide bandgap" is usually defined as 2.5 eV or greater. In the present invention, the bandgap of a wide bandgap semiconductor will be described in reference to a bandgap of 2.23 eV, which occurs at room temperature for 3C—SiC.

Figure 2:
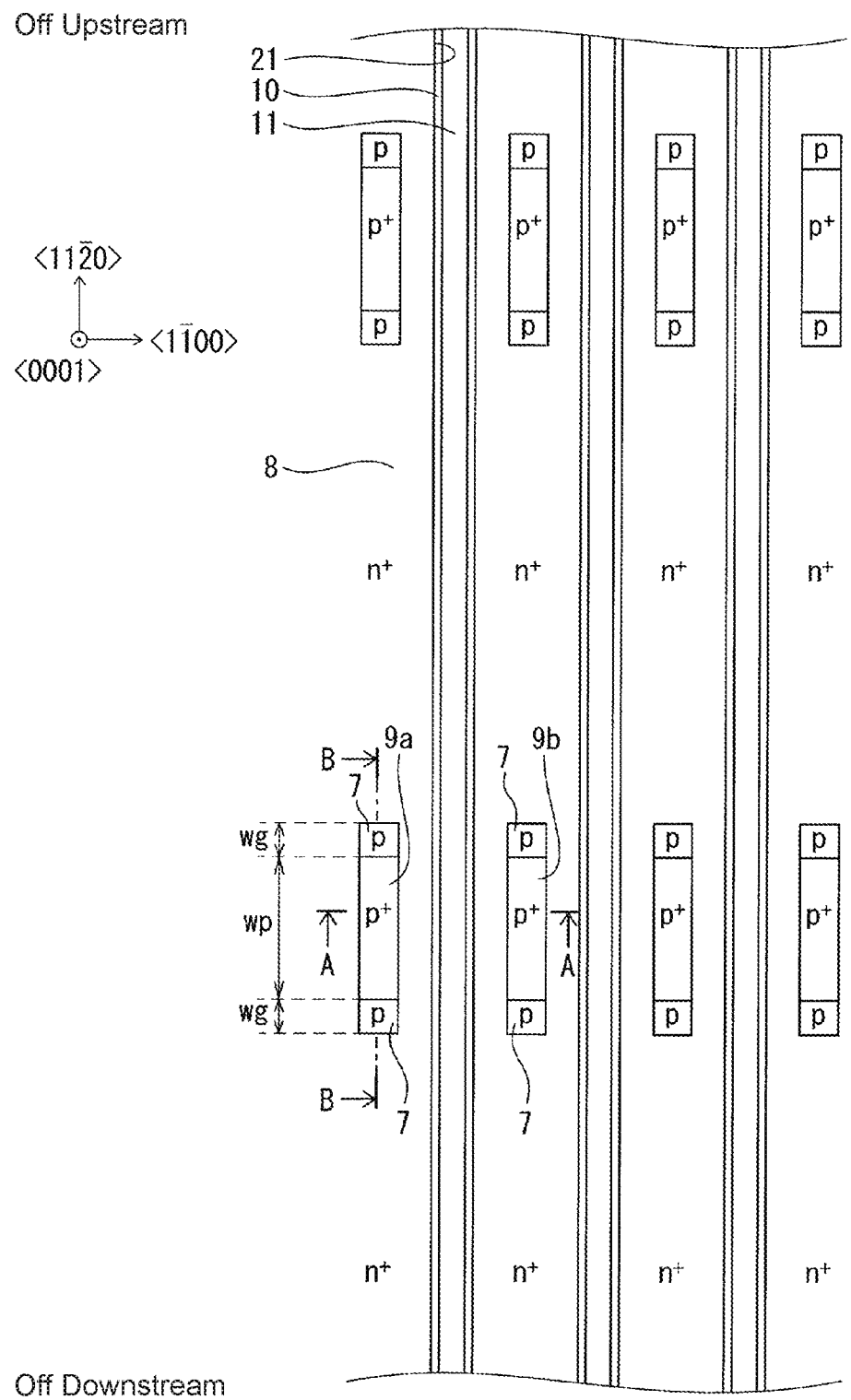
FIG. 2 is a plan view schematically showing an overview of the structure of the semiconductor device according to Embodiment 1 while leaving out regions above the SiC semiconductor layers.

The trench 21 going through the source region 8 and base region 7 in the depth direction has the bottom thereof reaching the current spreading layer 3. In FIG. 1, the bottom surface of the trench 21 is illustratively shown as being flat, but the bottom surface of the trench 21 may be curved. The trenches 21 of respective unit cell structures are arranged in a stripe shape on a planar pattern as shown in FIG. 2, but the pattern may be a rectangular planar pattern or polygonal planar pattern such as hexagonal.

The gate insulating film 10 can be, in addition to a silicon dioxide film (SiO$_2$ film), a silicon oxynitride (SiON) film, a single layer film having a greater dielectric constant than an SiO$_2$ film, a composite film in which a plurality of these films have been laminated, or the like. Specifically, the gate insulating film can be a strontium oxide (SrO) film, a silicon nitride (Si$_3$N$_4$) film, an aluminum oxide (Al$_2$O$_3$) film, a magnesium oxide (MgO) film, an yttrium oxide (Y$_2$O$_3$) film, or the like. In addition, the gate insulating film can be a hafnium oxide (HfO$_2$) film, a zirconium oxide (ZrO$_2$) film, a tantalum oxide (Ta$_2$O$_5$) film, a bismuth oxide (Bi$_2$O$_3$) film, or the like.

The material of the gate embedded electrode 11 can be a polysilicon layer (a doped polysilicon layer) to which a high concentration of impurities has been added, for example. A first main electrode (source electrode) 16 is disposed via the interlayer insulating film 12 on the gate embedded electrode 11 separated from a gate surface electrode (not shown) positioned in the depth of the sheet of FIG. 1. The source electrode 16 is electrically connected to the source region 8 and base contact regions 9a, 9b.

As shown in FIG. 1, the lower layers of the source electrode 16 include source contact layers 13a, 13b, a bottom barrier metal layer 14, and a top barrier metal layer 15. The source contact layers 13a, 13b are arranged so as to metallurgically connect to the respective base contact regions 9a, 9b. The bottom barrier metal layer 14 is disposed so as to metallurgically connect to the source region 8 and cover the interlayer insulating film 12. The top barrier metal layer 15 is disposed so as to cover the source contact layers 13a, 13b and bottom barrier metal layer 14. The source electrode 16 is disposed so as to cover the top barrier metal layer 15. For example, the source contact layers 13a, 13b are nickel (Ni) silicide films, the bottom barrier metal layer 14 is a titanium nitride (TiN) film, and the top barrier metal layer 15 is a laminated structure of titanium (Ti)/TiN/Ti. Furthermore, the source electrode 16 can be made of an aluminum (Al) film, and the gate surface electrode can be a similar material to the source electrode 16.

A second main electrode (drain electrode) 17 is disposed on the bottom surface side of the drift layer 2 so as to contact the drift layer 2. The drain electrode 17 can be a single layer film made of gold (Au) or a metal film in which Al, nickel (Ni), and Au have been laminated in the stated order, for example. A metal plate such as molybdenum (Mo) or tungsten (W) may be further laminated on the bottommost layer thereof. The drift layer 2 and base region 7 are both epitaxially grown films.

During operation of the semiconductor device according to Embodiment 1, when a positive voltage is applied to the drain electrode 17 and a positive voltage of a threshold or above is applied to the gate embedded electrode 11, an inversion layer (channel) is formed on the gate embedded electrode 11 side of the base region 7, turning the device ON. In the ON state, current flows from the drain electrode 17 to the source electrode 16 through the drain region 1, drift layer 2, inversion layer of the base region 7, and source region 8. Meanwhile, if the voltage applied to the gate embedded electrode 11 is lower than the threshold, the inversion layer is not formed in the base region 7, thus turning the device OFF, and current does not flow from the drain electrode 17 to the source electrode 16.

As shown in FIG. 2, two first gaps are respectively provided with approximately the same width wg on both ends in the <11-20> direction between the base contact regions 9a, 9b and the source region 8, and the top surface of the base region 7 is exposed to the inner side of the first gap. The first gaps are provided so as to respectively contact the off upstream end of the base contact regions 9a, 9b positioned on the upper side in FIG. 2 and the off downstream end the base contact regions 9a, 9b positioned on the bottom side in FIG. 2. The width of the first gap in the <1-100> direction orthogonal to the direction in which the trench 21 extends is approximately the same width as the width of the base contact regions 9a, 9b. The base contact regions 9a, 9b have a width wp along the <11-20> direction. As shown in FIG. 3, the base contact regions 9a, 9b are disposed in the center region inside the opening formed between the adjacent source regions 8.

Figure 4:
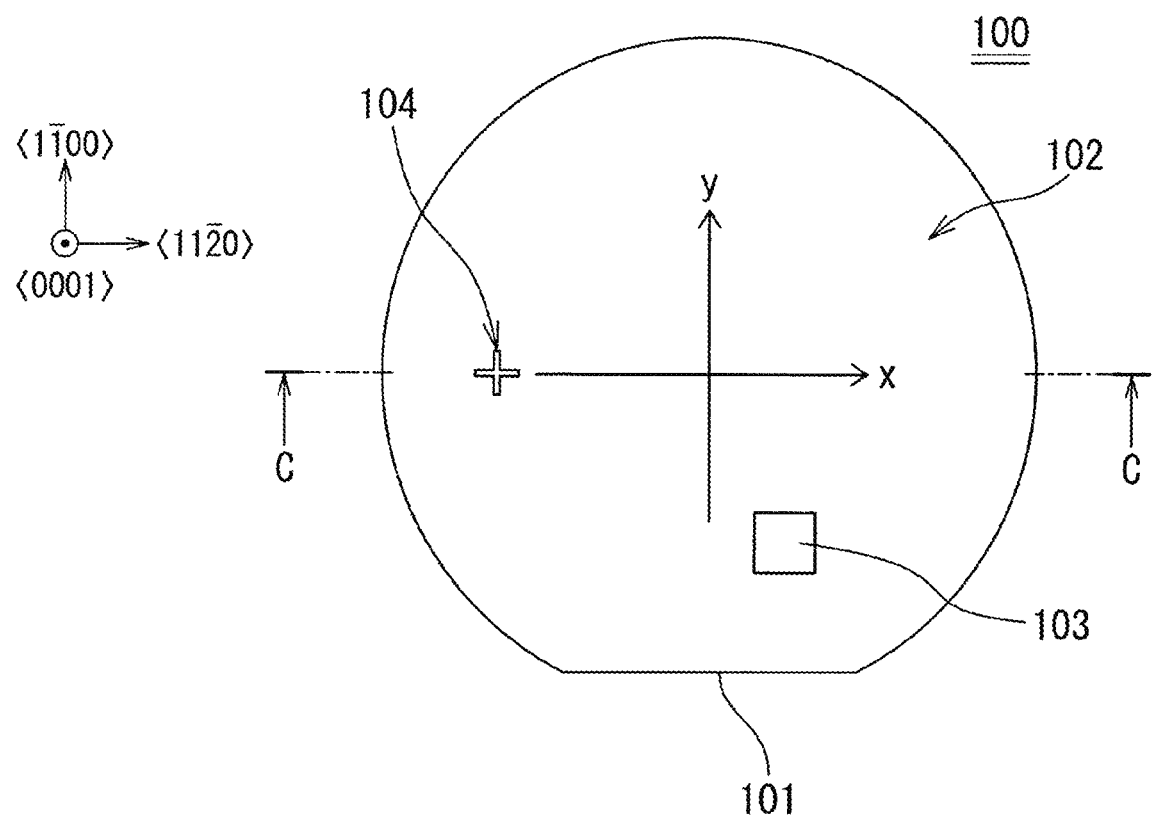
FIG. 4 is a plan view schematically showing an overview of the structure of a semiconductor wafer used in the manufacturing of the semiconductor device according to Embodiment 1.
Figure 5:
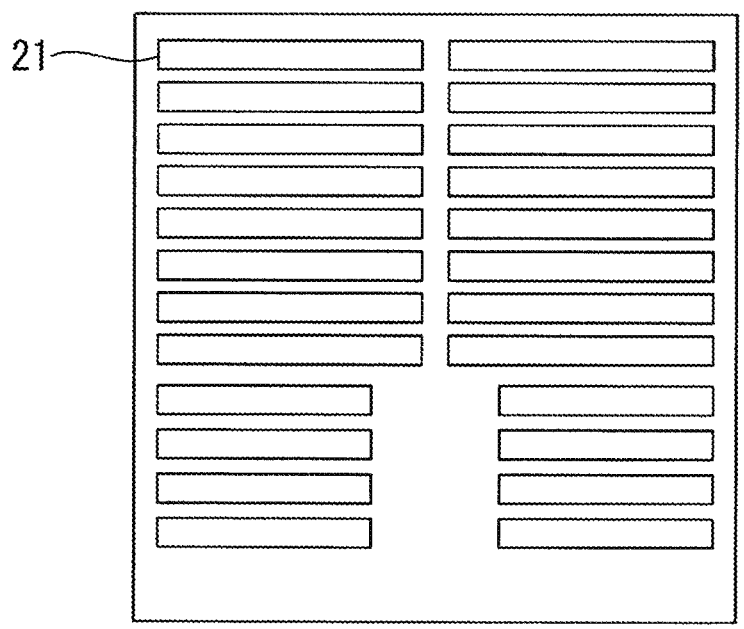
FIG. 5 is a plan view schematically showing the placement of trenches in the semiconductor device according to Embodiment 1.

As shown in FIG. 4, the semiconductor device according to Embodiment 1 is fabricated with the foundation being a semiconductor wafer 100 made of SiC. An orientation flat 101 showing the crystal orientation of the semiconductor wafer 100 is provided on the outer periphery of the semiconductor wafer 100. The semiconductor wafer 100 is sliced along a direction of a surface tilted by a prescribed offset angle (off-angle) θ relative to a specific crystal orientation, and the position of the orientation flat 101 is determined by the crystal orientation. A notch may be provided in the outer periphery of the semiconductor wafer 100 instead of the orientation flat 101. A single semiconductor chip 103 is illustratively shown on the surface 102 of the semiconductor wafer illustratively shown in FIG. 4. Furthermore, as shown in FIG. 5, the trenches 21 extend in stripe shapes along the <11-20> direction in the top surface of the semiconductor chip 103. The crystal plane of the side walls of the trenches is the (11-20) a-plane or the (1-100) m-plane.

Figure 6:
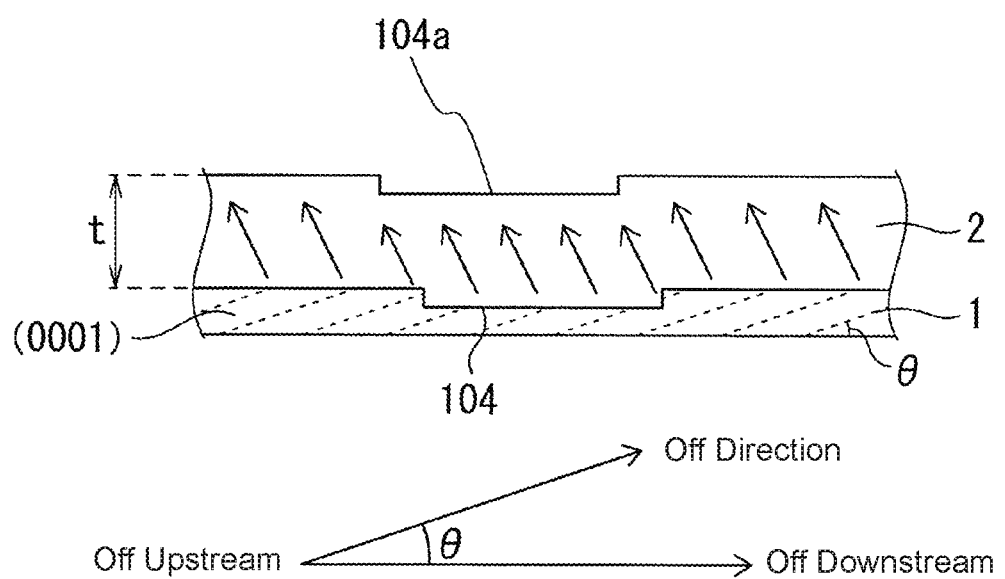
FIG. 6 is a cross-sectional view of main components as seen from a direction along line C-C in FIG. 4, and schematically describes a positional deviation state of an alignment mark caused by an off-angle and epitaxial growth.

As shown in FIG. 6, in the semiconductor device according to Embodiment 1, the top surface of the drain region 1 has an off-angle θ of approximately 4° to 8° in the <11-20> direction relative to the <0001> (c-axis) direction. The off-angle θ is the angle formed between the surface 102 of the semiconductor wafer 100 and the plane (basal plane) perpendicular to the c-axis, which is the (0001) plane Si-plane or the (000-1) plane C-plane. An alignment mark 104 for positioning is also provided on the top surface of the drain region 1. When providing the drift layer 2 on the drain region 1 via epitaxial growth, the top surface of the drift layer 2 has formed thereon an alignment mark 104a that has been transferred from the initial alignment mark 104 on the top surface positionally deviating by a prescribed distance in the direction parallel to the main surface toward the off upstream side.

<Setting of Positional Deviation Width>

Figure 7:
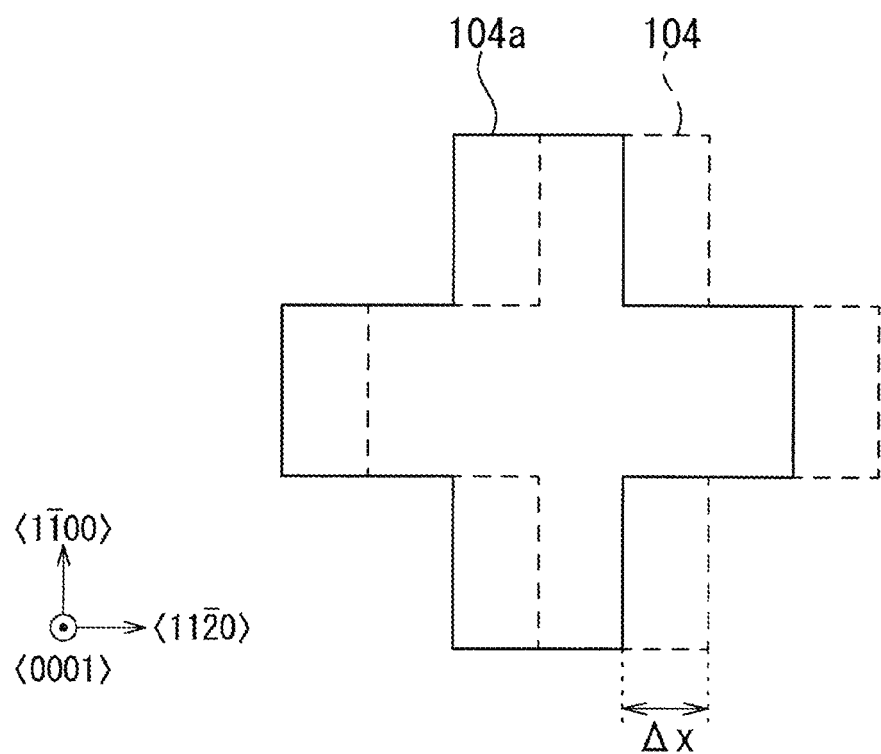
FIG. 7 is a plan view schematically describing a state in which two alignment marks for which positional deviation has occurred are seen from the top surface.

Next, a method of setting the positional deviation width will be described. In FIG. 7, a case is illustratively shown in which a single epitaxially grown film, for example, is deposited as the drift layer 2 on the drain region 1 where the initial alignment mark 104 is formed. As shown in FIG. 7, if the initial alignment mark 104 and transferred alignment mark 104a, which are positionally deviated from each other, are seen from a direction in which the main surface of the semiconductor device is viewed in the front, the same shaped alignment marks are observed as being double.

Figure 8:
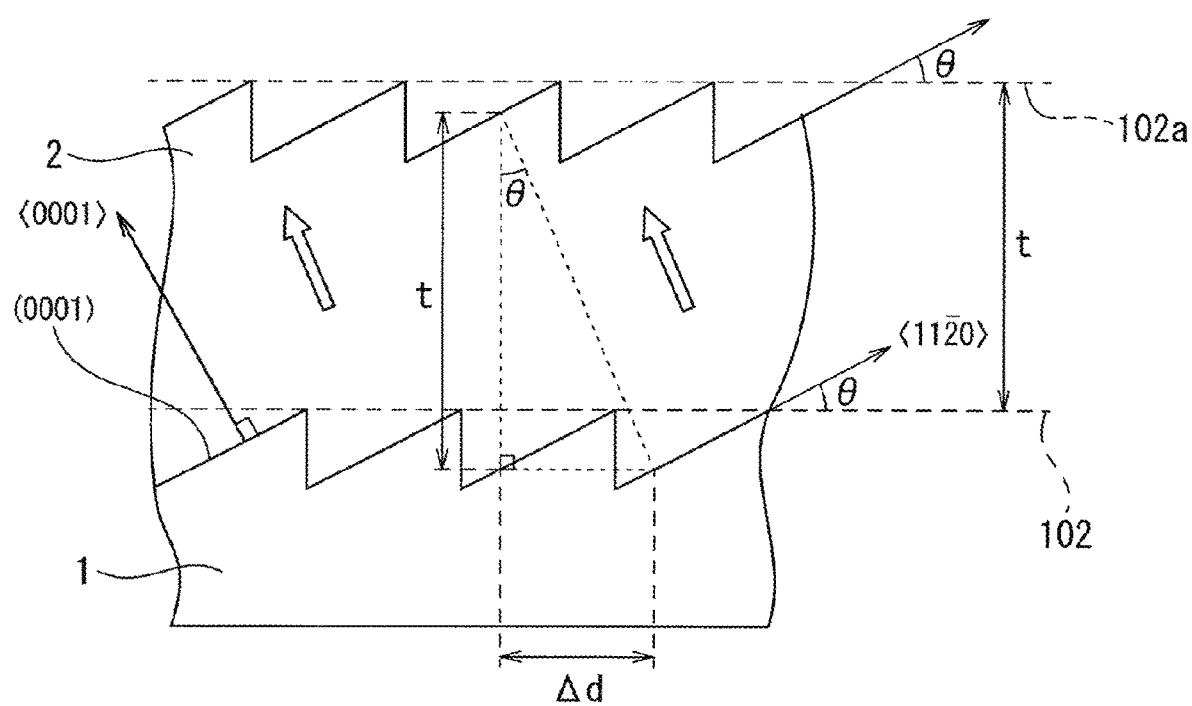
FIG. 8 is a cross-sectional view of main components and schematically describes a method of setting a positional deviation width of an alignment mark.

As shown in FIG. 8, the height between the surface 102 of the drain region 1 and a surface 102a of the deposited drift layer 2 is set as the thickness of the epitaxially grown film. If an additional epitaxially grown film is added on top of the drift layer 2, then the sum of the thicknesses of all epitaxially grown films including the added epitaxially grown films is used to set the positional deviation width as a "thickness t of the epitaxially grown film."

In Embodiment 1, the positional deviation width Δx caused by the off-angle θ and epitaxial growth is set as follows using the thickness t and off-angle θ.

$$\Delta x = t \times \tan\theta \quad (1)$$

For example, when the thickness t, which is the sum of the thicknesses of all epitaxially grown films, is 1.6 μm, and the off-angle θ is 4°, then the positional deviation width Δx can be set to approximately 0.112 μm from formula (1). In the semiconductor device according to Embodiment 1, the width wp in the <11-20> direction of the base contact region 9a is set such that the width wg of the first gap is at least this positional deviation width Δx.

The upper limit value of the positional deviation width Δx is selected as the smaller of the sum t of the thicknesses of the epitaxially grown films and the width of the base contact region. This is because if the upper limit value is greater than the width of the base contact region 9a, then the proportion of regions where effective contact can be made becomes too low.

Figure 9:
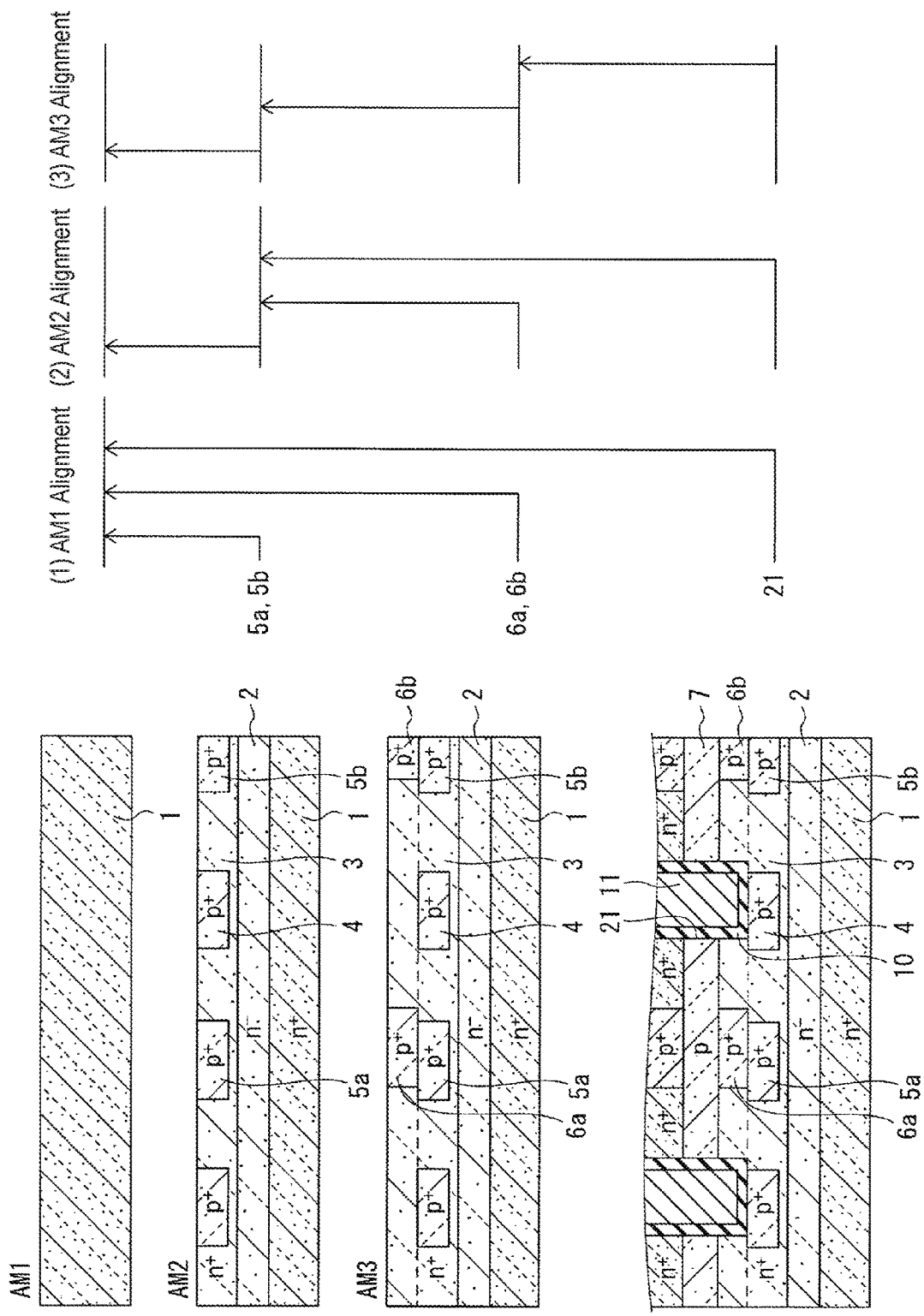
FIG. 9 is a view for schematically describing, along with cross-sectional views, the method for setting the alignment mark used for positioning.

As shown in FIG. 9, the inventor of the present invention performed experiments for measuring the positional deviation width in cases in which alignment was performed by using differing alignment marks AM1 to AM3. Specifically, first, the alignment mark AM1 was formed on the top surface of the drain region 1, the alignment mark AM2 was formed at the same height as the top surface of the first embedded regions 5a, 5b, and the alignment mark AM3 was formed at the same height as the top surface of the second embedded regions 6a, 6b. Then, directly before fabricating the first embedded regions 5a, 5b, second embedded regions 6a, 6b, and trenches 21, the alignment marks AM1 to AM3 were differed to perform alignment with the conditions (1) to (3) described below.

(1) The alignment mark AM1 was used for all fabrications of the first embedded regions 5a, 5b, second embedded regions 6a, 6b, and the trenches 21.

(2) The alignment mark AM1 was used for the fabrication of the first embedded regions 5a, 5b, and the second alignment mark AM2 was used for the fabrication of the second embedded regions 6a, 6b and the trenches 21.

(3) The alignment mark AM1 was used for the fabrication of the first embedded regions 5a, 5b, the second alignment mark AM2 was used for the fabrication of the second embedded regions 6a, 6b, and the third alignment mark AM3 was used for the fabrication of the trenches 21. The same alignment mark was not used for all fabrications.

Figure 10:
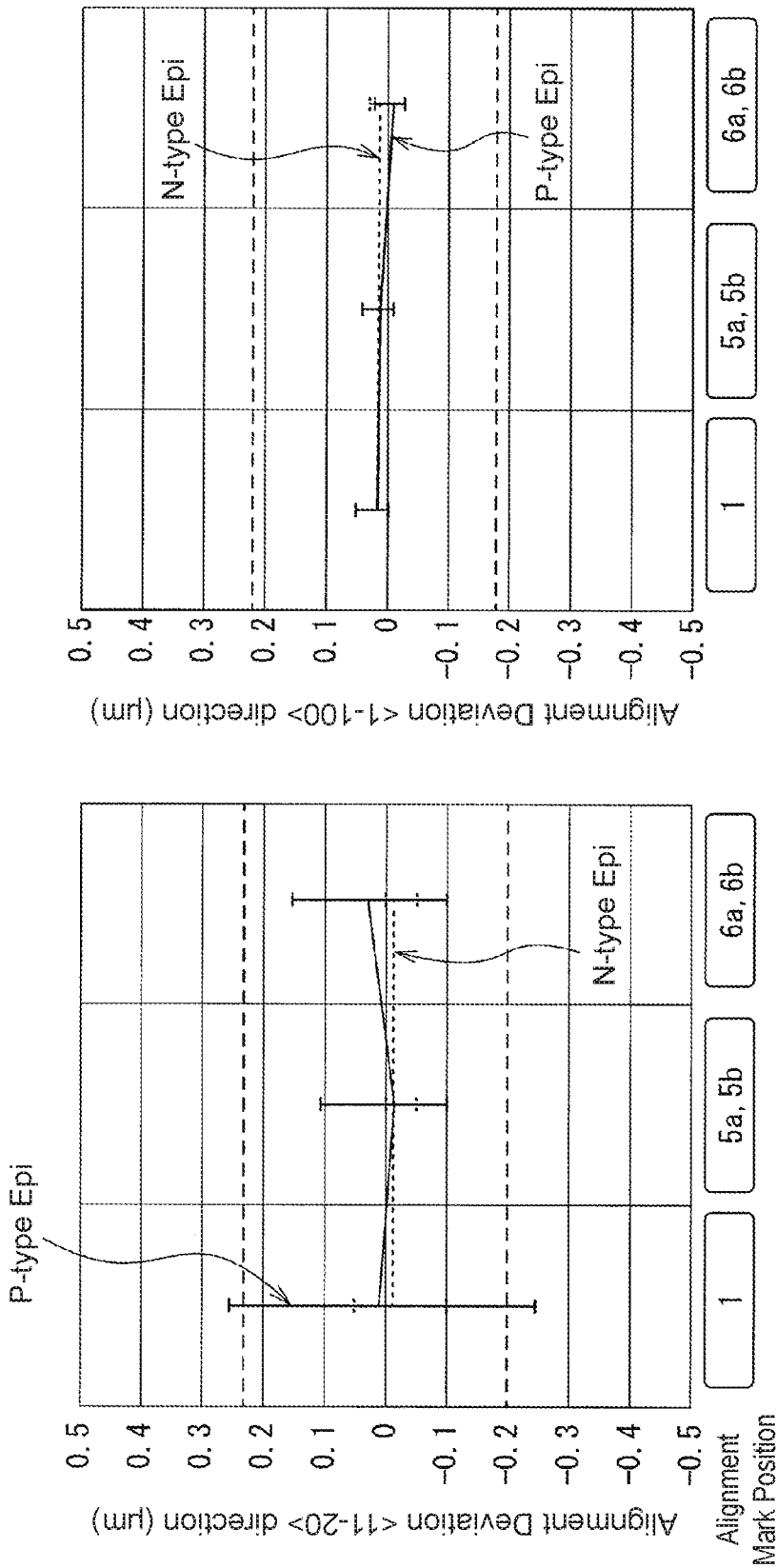
FIG. 10A is a graph diagram for describing the positional deviation width in the <11-20> direction.
FIG. 10B is a graph diagram for describing the positional deviation width in the <1-100> direction.

FIG. 10A shows the positional deviation width (alignment deviation width) of the trench 21 in the <11-20> direction measured for each condition described above. FIG. 10B shows the positional deviation width (alignment deviation width) of the trench 21 in the <1-100> direction measured for each condition described above. FIG. 10A and FIG. 10B also respectively show the use of a p-type epitaxially grown film with a solid line and the use of an n-type epitaxially grown film with a dashed line. The thickness of the epitaxially grown film used in the experiment was approximately 1.1 μm.

As can be understood from FIG. 10A and FIG. 10B, the positional deviation width Δx in the <11-20> direction is much greater than the positional deviation width Δx in the <1-100> direction. It can also be understood that the p-type epitaxially grown film shown by the solid line has a greater positional deviation width Δx than the n-type epitaxially grown film shown by the dashed line. Taking into consideration the results shown in FIG. 10A and FIG. 10B, the inventor of the present invention performed research with the aim of continually using the initial alignment mark 104 on the top surface of the drain region 1 even in subsequent processes. The result was the completion of the present invention where the same alignment mark is used throughout, which can reduce the number of processes while suppressing the effects of lithography deviations by setting the positional deviation width Δx defined in formula (1) above and then performing subsequent photolithography processes.

<Method of Manufacturing Semiconductor Device>

Next, a method of manufacturing the semiconductor device according to Embodiment 1 will be described using FIGS. 11 to 21. The method of manufacturing the trench gate MOSFET described below is one example, and various other types of methods of manufacturing can be performed within the scope set forth in the claims.

Figure 11:
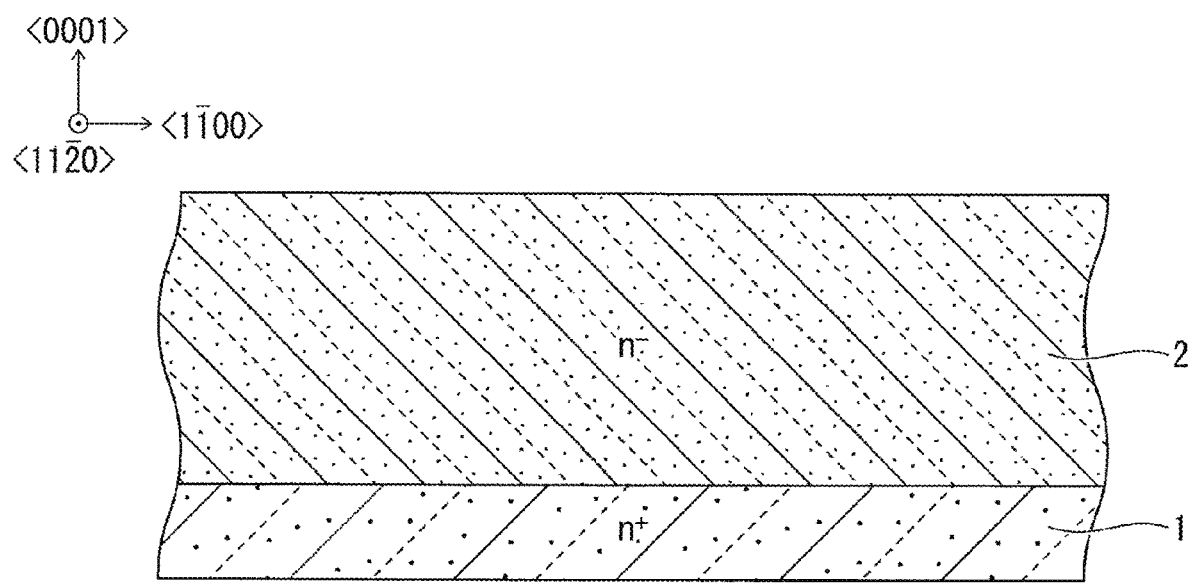
FIG. 11 is a cross-sectional view of a step schematically showing an overview of the method of manufacturing the semiconductor device according to Embodiment 1.

First, an n$^+$ SiC substrate to which an n-type impurity such as nitrogen (N) has been added is prepared. In the description below, the SiC substrate is a 4H—SiC substrate and has an off-angle of 4°. As shown in FIG. 11, the n$^-$ drift layer 2 is epitaxially grown on the top surface of the drain region 1, which is the n+ SiC substrate. The epitaxial growth also gives the top surface of the drift layer 2 an off-angle of 4°.

Figure 12:
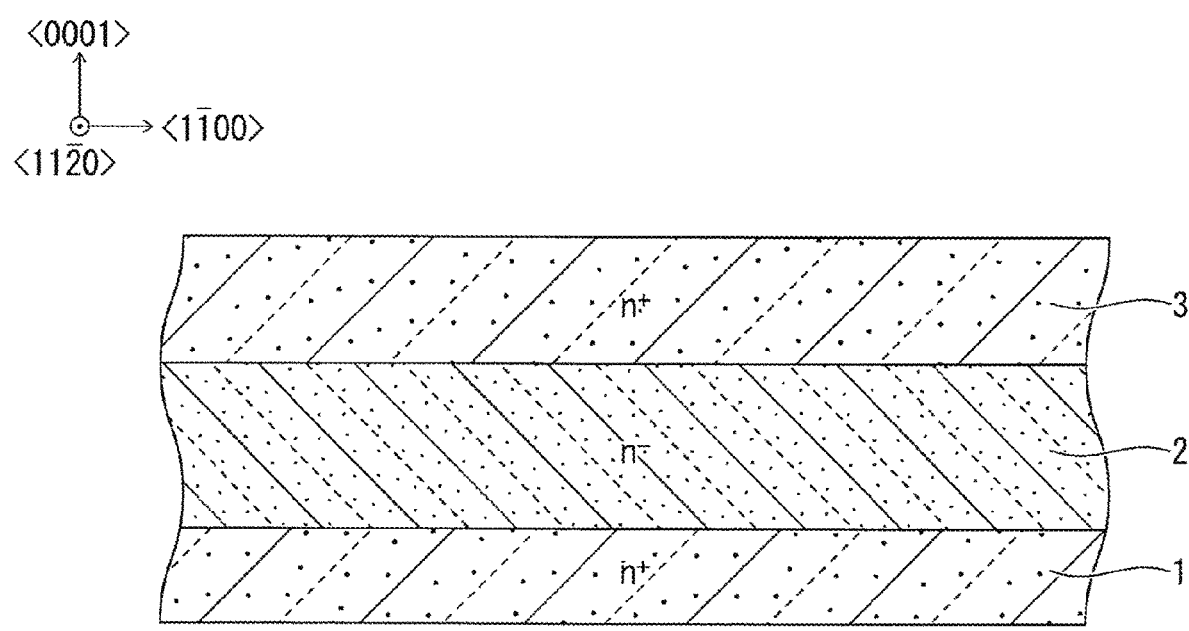
FIG. 12 is a cross-sectional view of a step, after FIG. 11, schematically showing an overview of the method of manufacturing the semiconductor device.

Next, multiple-stage ion implantation is performed from the top surface side of the drift layer 2 into the entire surface of the drift layer 2 with n-type impurity ions such as nitrogen (N). Thereafter, the implanted n-type impurity ions are activated by a heat treatment, and the $n^+$ current spreading layer 3 is formed, as shown in FIG. 12. The current spreading layer 3 may be epitaxially grown on the top surface of the drift layer 2, and the epitaxial growth also gives the top surface of the current spreading layer 3 an off-angle of 4°. Furthermore, the current spreading layer 3 need not necessarily be formed, and the following steps may be performed on the drift layer 2.

Next, in order to form the first embedded regions 5a, 5b shown in FIG. 1, a photoresist film is coated on the current spreading layer 3, and photolithography is used to pattern the photoresist film. The patterned photoresist film is used as an ion implantation mask to perform multiple-stage ion implantation into deep positions with p-type impurity ions such as Al. Thereafter, the photoresist film is removed through wet processing or the like.

Furthermore, in order to form the gate bottom protection region 4, a new photoresist film is coated on the current spreading layer 3, and the new photoresist film is patterned using photolithography. The patterned photoresist film is used as a mask for ion implantation, and multiple-stage ion implantation is performed perpendicularly to the top surface of the current spreading layer 3 with p-type impurity ions such as Al at shallower positions than the previous round. Thereafter, the photoresist film is removed through wet processing or the like.

Next, in order to form the second embedded regions 6a, 6b shown in FIG. 1, a new photoresist film is coated on the current spreading layer 3, and photolithography is used to pattern the photoresist film. The patterned photoresist film is used as an ion implantation mask to perform multiple-stage ion implantation with p-type impurity ions such as Al. Thereafter, the photoresist film is removed through wet processing or the like.

Next, the implanted p-type impurity ions are activated by a heat treatment, and the $p^+$ gate bottom protection region 4 is selectively formed inside the current spreading layer 3. In addition, the $p^+$ first embedded regions 5a, 5b are selected formed as rectangular regions inside the current spreading layer 3 at positions deeper than the gate bottom protection region 4. At the same time, the $p^+$ second embedded regions 6a, 6b are selectively formed as rectangular regions in the upper part of the current spreading layer 3, and thus the base bottom embedded regions (5a, 6a), (5b, 6b) are formed into a pattern in units of rectangles.

Figure 13:
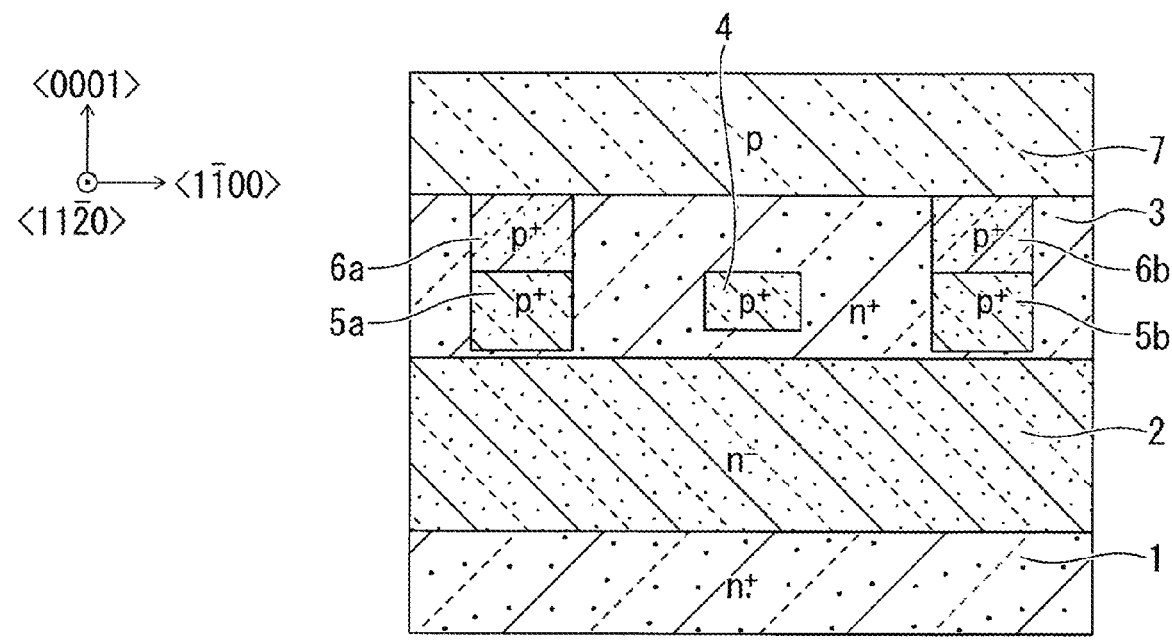
FIG. 13 is a cross-sectional view of a step, after FIG. 12, schematically showing an overview of the method of manufacturing the semiconductor device.

Next, as shown in FIG. 13, the p-type base region 7 is epitaxially grown on the top surface of the current spreading layer 3. The epitaxial growth also gives the top surface of the base region 7 an off-angle of 4°. Next, the position of the alignment mark on the drain region 1 is read using a reading device, and the read position information is used to position the semiconductor substrate. A photoresist film (not shown) is coated on the base region 7, and photolithography is used to pattern the photoresist film so as to have an opening in a planar pattern.

Figure 14:
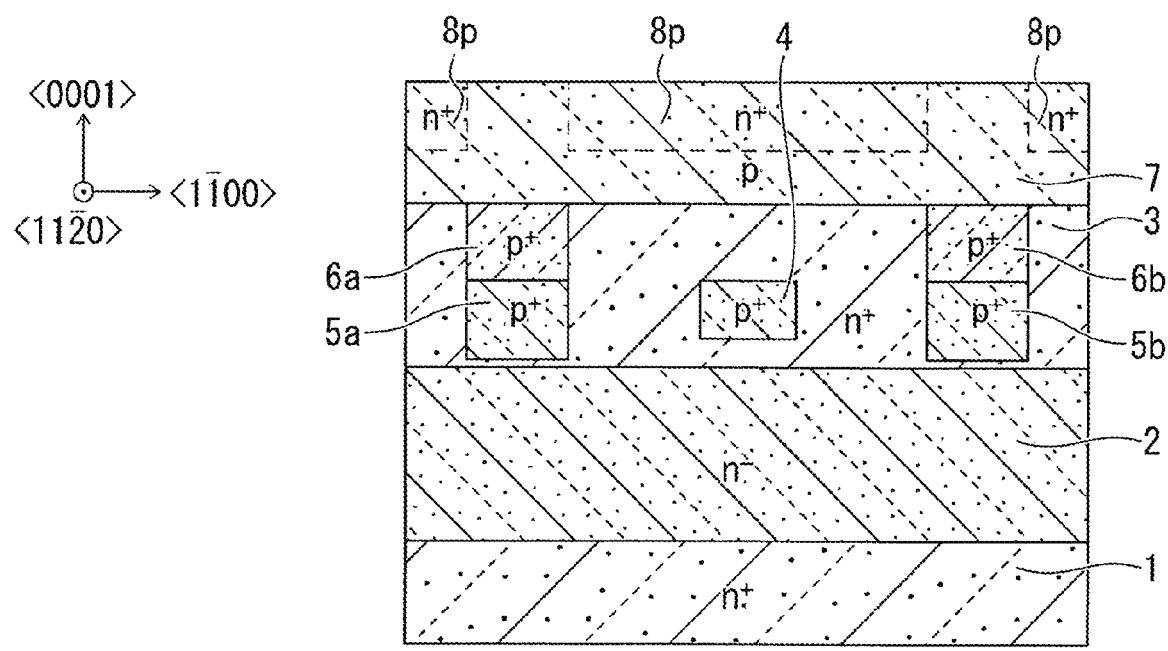
FIG. 14 is a cross-sectional view of a step, after FIG. 13, schematically showing an overview of the method of manufacturing the semiconductor device.

As shown in FIG. 14, multiple-stage ion implantation of n-type impurity ions such as N is performed using the patterned photoresist film as an ion implantation mask, and a first planned region 8p that will become the source region 8 is formed. The n-type impurity ions are not implanted where the patterned photoresist film exists, and thus the first planned region 8p is selectively formed such that the region where the base region 7 remains has an opening in a planar pattern. Thereafter, the photoresist film is removed through wet processing or the like.

Figure 15:
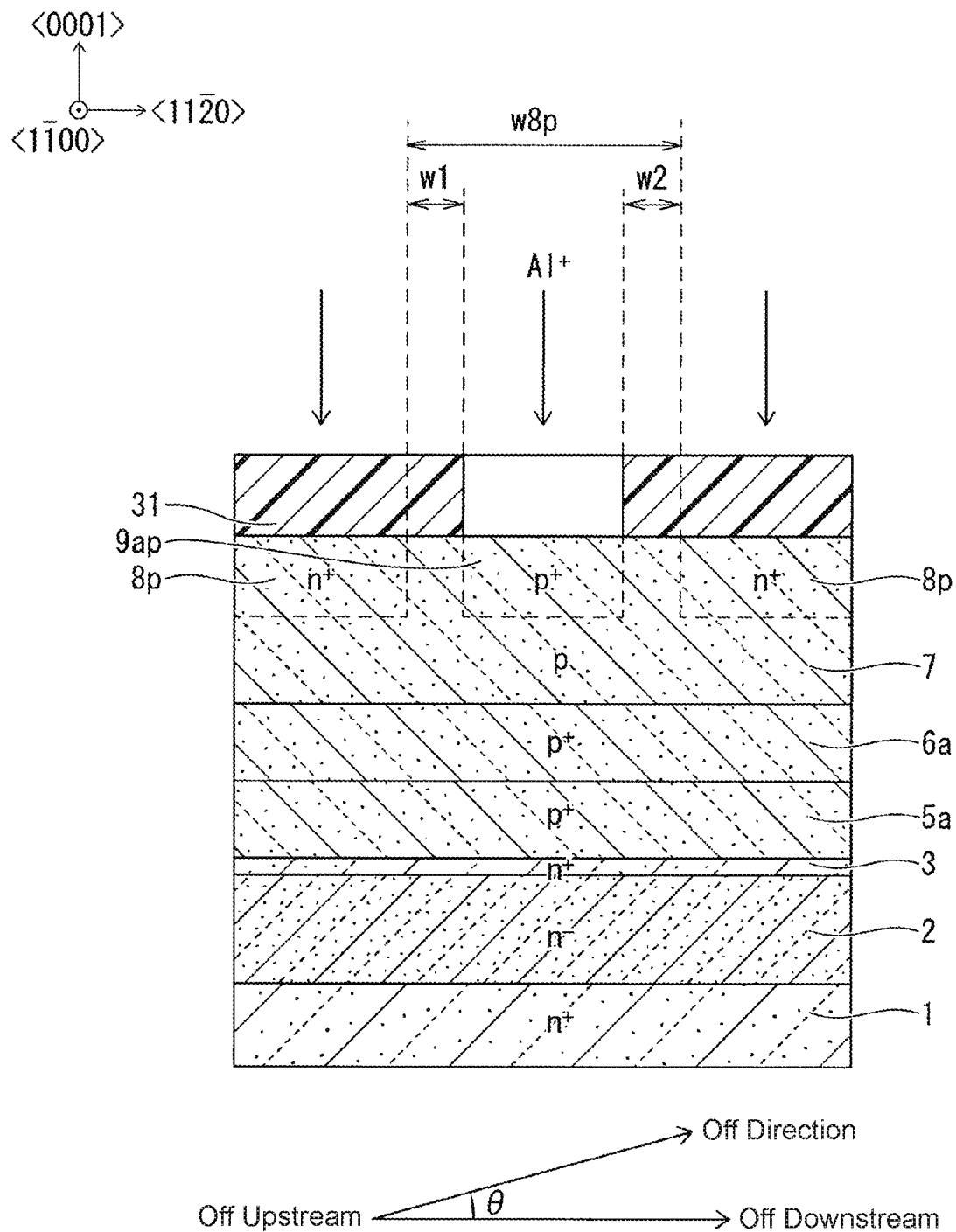
FIG. 15 is a cross-sectional view of a step, after FIG. 14, schematically showing an overview of the method of manufacturing the semiconductor device.

Next, the position of the alignment mark on the drain region 1 is read again using the reading device, and the read position information is used to position the semiconductor substrate. Then, as shown in FIG. 15, a new photoresist film is coated on the top surface of the base region 7 and first planned region 8p, and photolithography is used to pattern the new photoresist film and form an ion implantation mask 31.

The end of the opening of the ion implantation mask 31 in the <11-20> direction protrudes to the inner side of the opening in the adjacent first planned region 8p, and the photoresist film is selectively patterned and formed to cover the edge of the opening in the first planned region 8p. Each of the protrusion widths w1, w2 of both ends of the ion implantation mask 31 are controlled in advance such that the base contact region 9a after activation protrudes by at least the positional deviation width Δx that has been set with respect to the edge of the opening in the source region 8. Multiple-stage ion implantation of p-type impurity ions such as Al is performed via this ion implantation mask 31 from the top surface side of the drift layer 2 to form a second planned region 9ap that will serve as the base contact region. In other words, the p-type impurity ions are implanted into the center region of the opening between the adjacent first planned regions 8p having the width w8p in FIG. 15 except for the portions having the left-side protrusion width w1 and right-side protrusion width w2.

Figure 16:
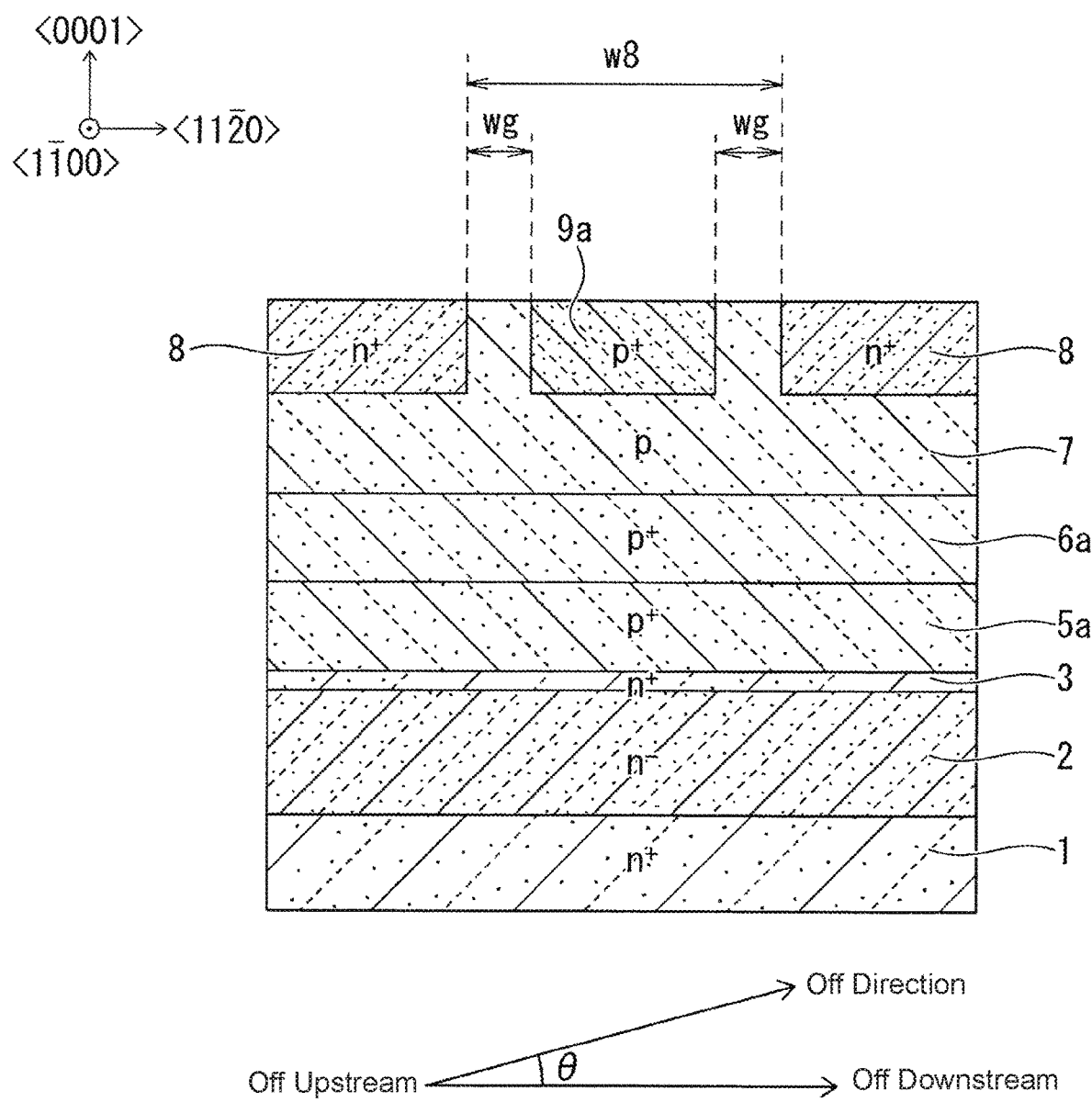
FIG. 16 is a cross-sectional view of a step, after FIG. 15, schematically showing an overview of the method of manufacturing the semiconductor device.

Thereafter, a heat treatment is performed to activate the first planned regions 8p and the second planned region 9ap, and as shown in FIG. 16, the $n^+$ source region 8 and $p^+$ base contact region 9a are formed on the top surface of the base region 7. FIG. 16 illustratively shows the state of the $n^+$ source region 8 and $p^+$ base contact region 9a in a case where no positional deviation has occurred.

Figure 17:
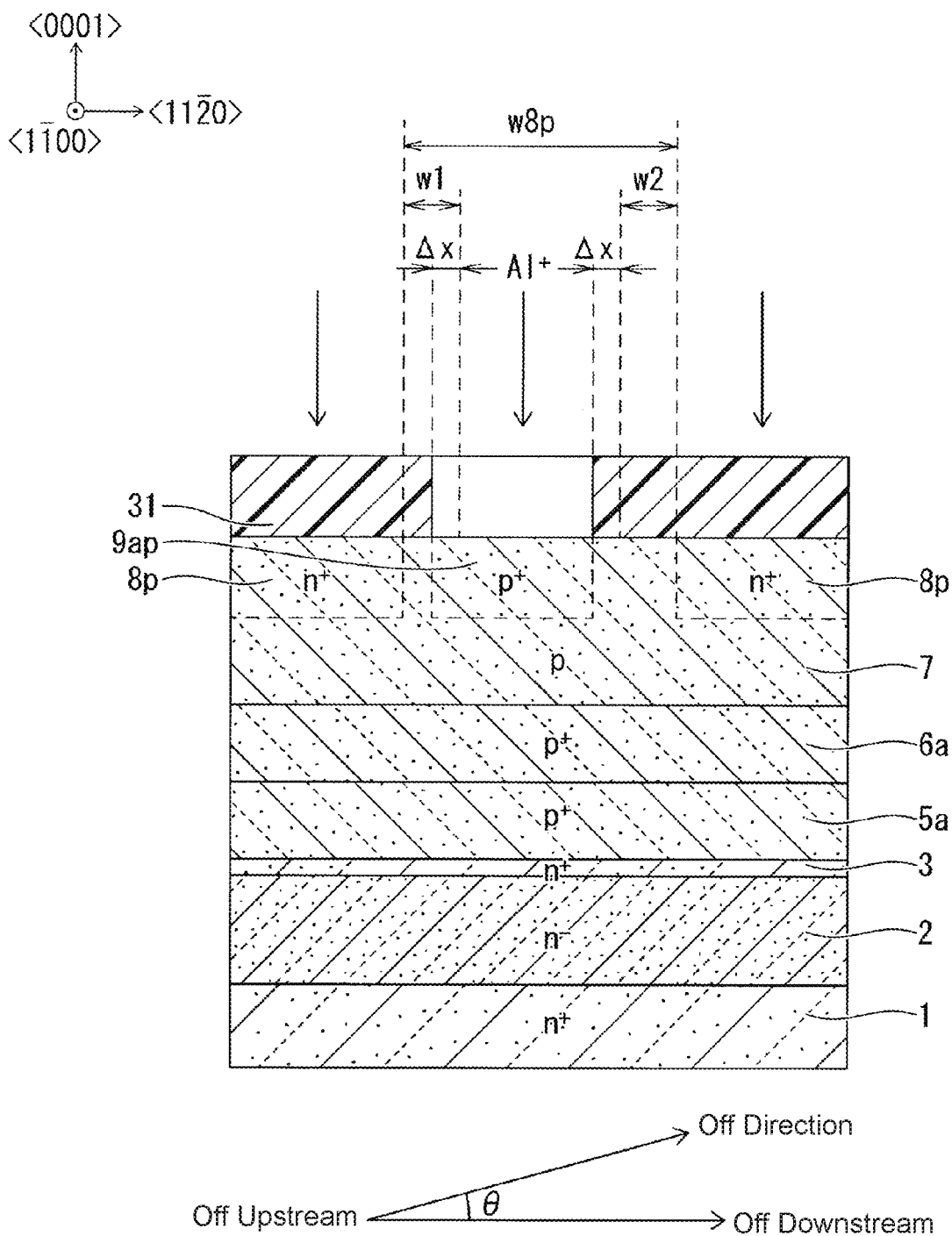
FIG. 17 is a cross-sectional view of a step, after FIG. 14, schematically showing an overview of the method of manufacturing the semiconductor device in a case where a reading error of an alignment mark has occurred.
Figure 18:
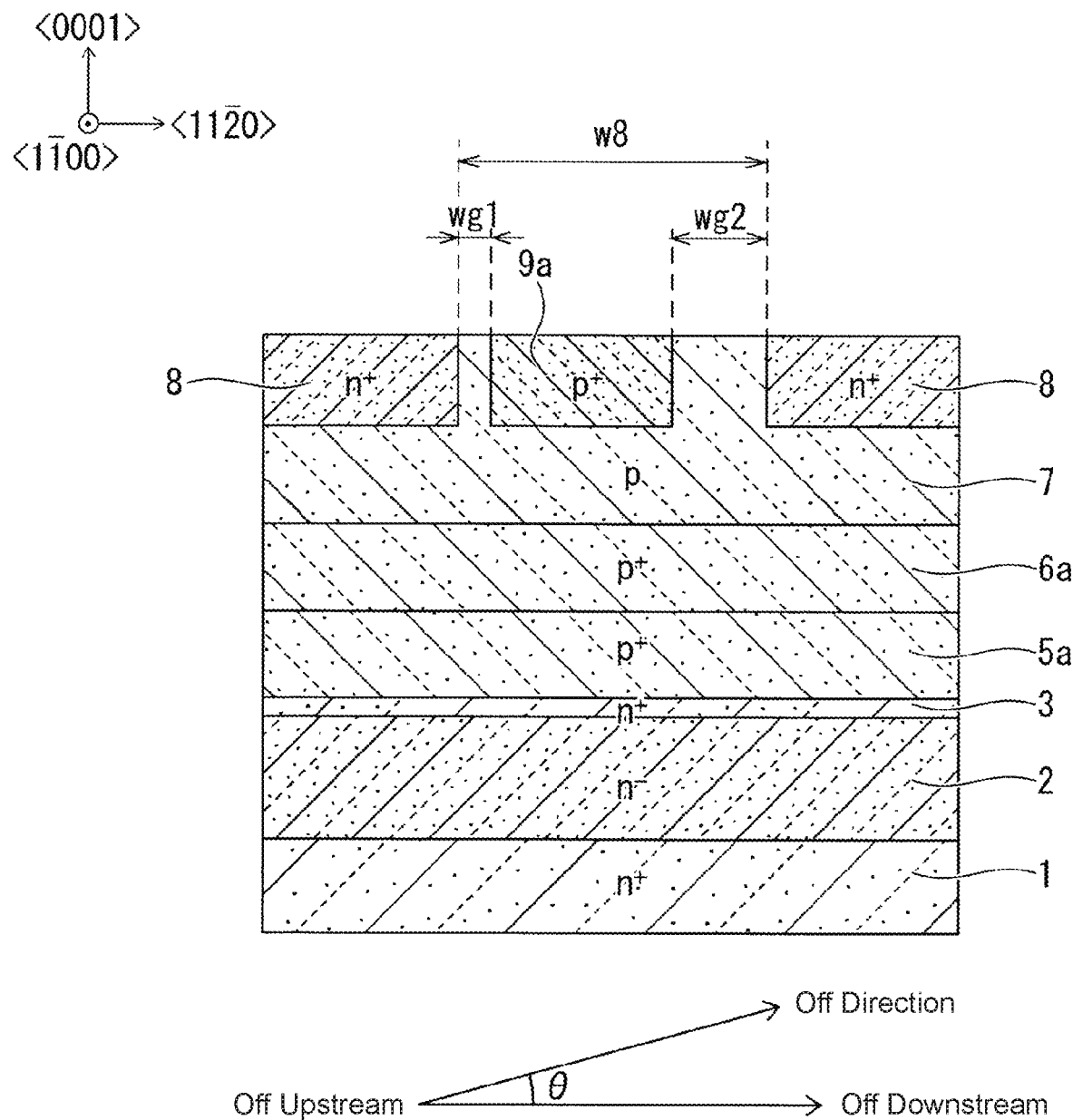
FIG. 18 is a cross-sectional view of a step, after FIG. 17, schematically showing an overview of the method of manufacturing the semiconductor device in a case where a reading error of an alignment mark has occurred.
Figure 19:
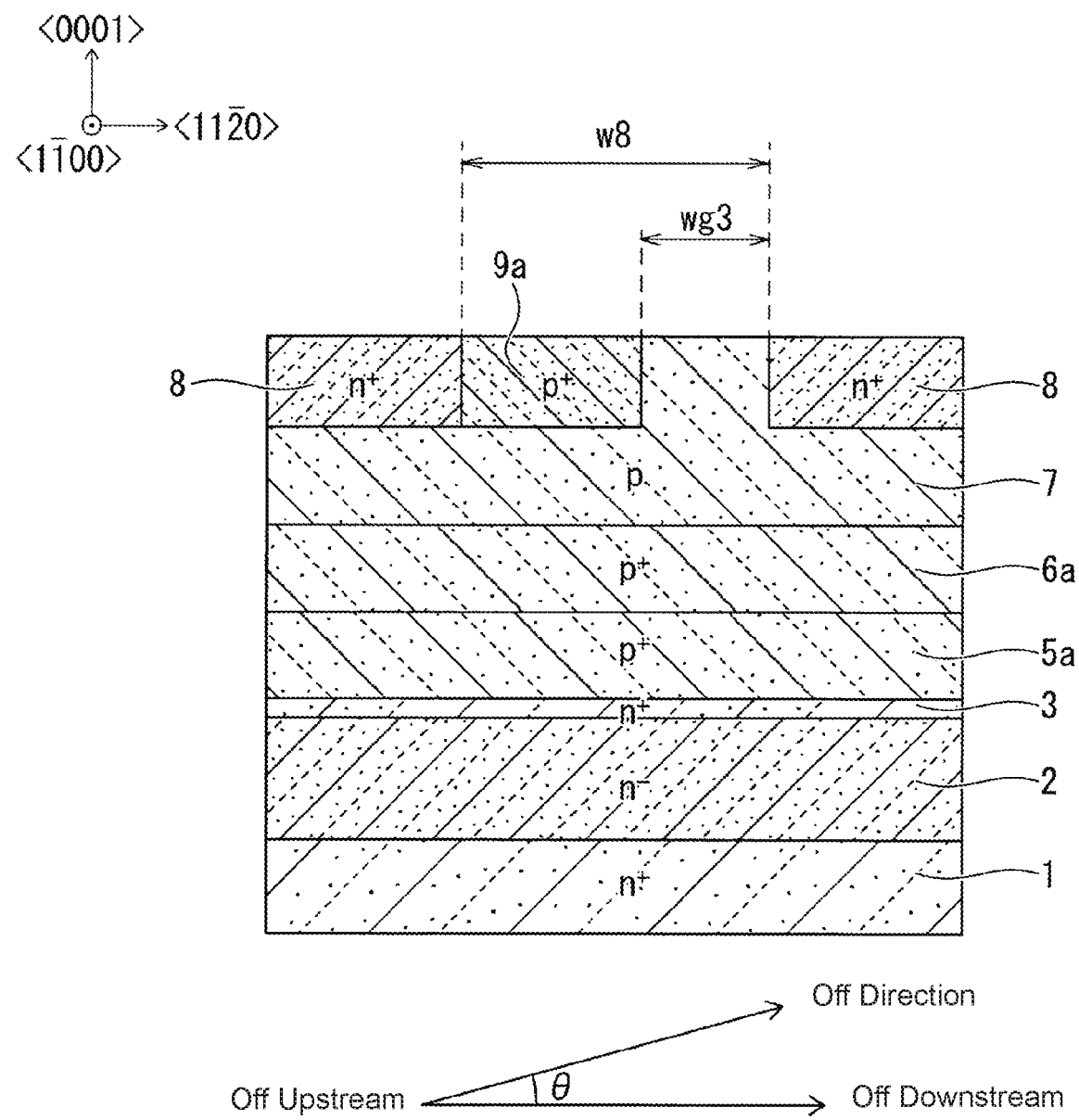
FIG. 19 is a cross-sectional view of a step, after FIG. 18, schematically showing an overview of the method of manufacturing the semiconductor device in a case where a reading error of an alignment mark has occurred.

Next, FIGS. 17 to 19 will be used to describe a case where a reading error has occurred between the reading of the alignment mark directly before formation of the first planned regions 8p and the reading of the alignment mark directly before formation of the second planned region 9ap thereafter. As shown in FIG. 17, due to the positional deviation of the alignment mark, the opening in the ion implantation mask 31 formed on the base contact region 7 and first planned regions 8p is formed having a positional deviation width Δx relative to the opening in the first planned region 8p underneath. However, as shown by the left side portion of the opening in FIG. 17, even if the left end of the opening in the ion implantation mask 31 approaches the lower left side first planned region 8p by an amount equivalent to the positional deviation width Δx, the protrusion width w1 is set to be at least the positional deviation width Δx. Due to this, even if ion implantation of p-type impurity ions such as Al is performed from the top surface side of the drift layer 2 via a positionally deviated ion implantation mask 31, ions will not be overlappingly implanted into the first planned region 8p.

Accordingly, if a heat treatment is performed thereafter, then as shown in FIG. 18, the source region 8 and base contact region 9a can be formed without overlapping each other. Both left-right direction ends of the base contact region 9a in FIG. 18 have respectively formed thereon a left-side first gap having a width wg1 and a right-side first gap having a width wg2, and the width wg2 of the right-side first gap is at least the positional deviation width Δx.

Furthermore, as shown in FIG. 19, there could also be a case in which the base contact region 9a is formed close to the left side up to a position contacting the source region 8, but the state in which the source region 8 and base contact region 9a overlap each other can be avoided. The width wg3 of the right-side first gap of the base contact region 9a in FIG. 19 is at least the positional deviation width Δx. The subsequent steps following the state described with FIG. 15 will be described below.

Figure 20:
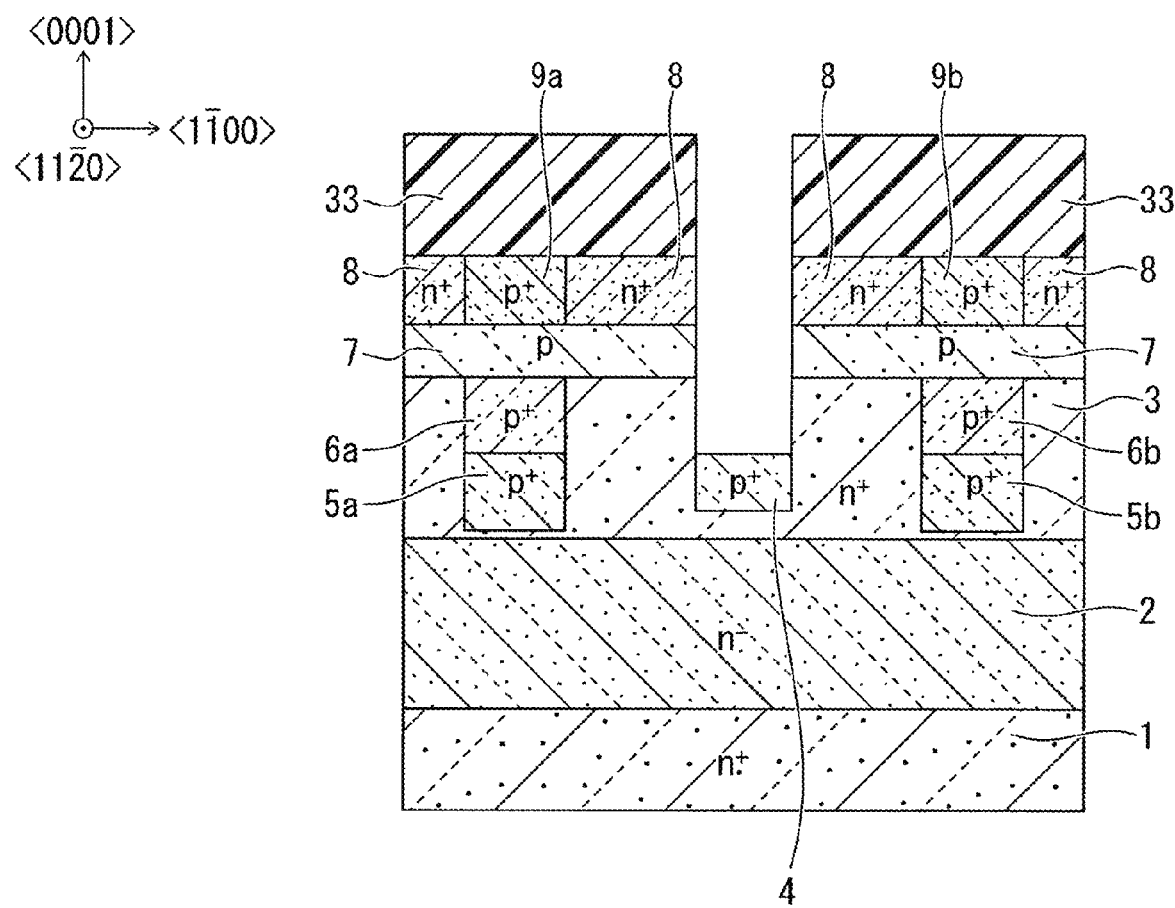
FIG. 20 is a cross-sectional view of a step, after FIG. 16, schematically showing an overview of the method of manufacturing the semiconductor device.

Next, a photoresist film is coated on the n⁺ source region 8 and p⁺ base contact regions 9a, 9b, and photolithography is used to pattern the coated photoresist film. The patterned photoresist film 33 is used as an etching mask, and dry etching etc. such as reactive ion etching (RIE) is used to selectively form the trench 21 going through the source region 8 and base region 7 and reaching the top of the current spreading layer 3, as shown in FIG. 20. Thereafter, the photoresist film 33 is removed through wet processing or the like. An oxide film may be formed on the source region 8 and p⁺ base contact regions 9a, 9b, and after the oxide film is patterned with the photoresist film, the trench 21 may be formed via dry etching while using the oxide film as an etching mask.

Figure 21:
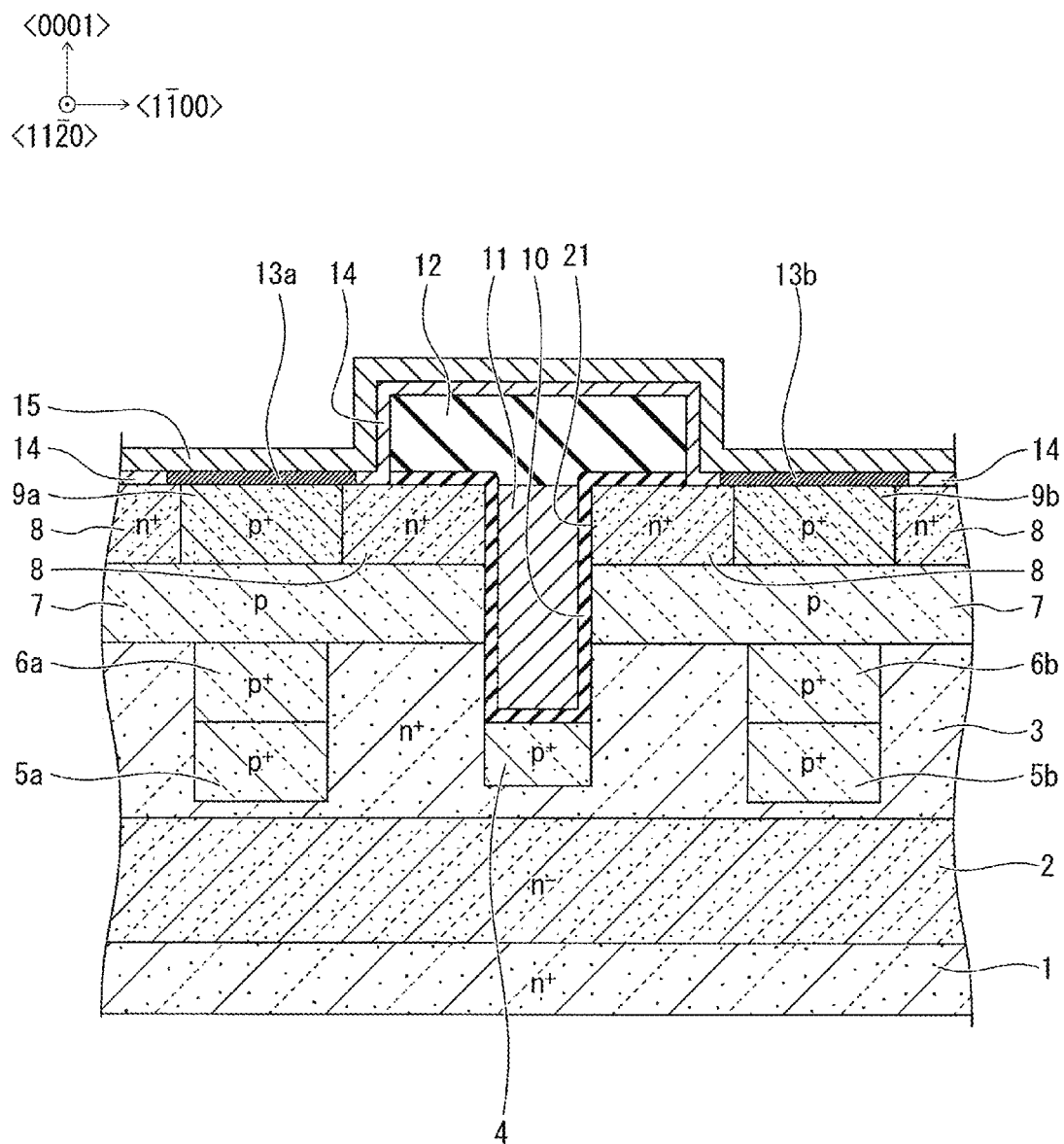
FIG. 21 is a cross-sectional view of a step, after FIG. 20, schematically showing an overview of the method of manufacturing the semiconductor device.

Next, as shown in FIG. 21, a thermal oxidation method or CVD etc. is used to form a gate insulating film 10 such as an SiO$_2$ film on the bottom surface and side surfaces of the trench 21 and the top surfaces of the source region 8 and p⁺ base contact regions 9a, 9b. Next, CVD etc. is used to deposit a doped polysilicon layer to which a high concentration of impurities such as N has been added onto the gate insulating film 10. Thereafter, etch-back is performed on the doped polysilicon layer to embed a polysilicon layer inside the trench 21 via the gate insulating film 10 in order to form a gate embedded electrode 11 made of the doped polysilicon layer.

Next, CVD etc. is used to deposit an interlayer insulating film such as an SiO$_2$ film on the gate embedded electrode 11 and gate insulating film 10. A photoresist film (not shown) is coated on the interlayer insulating film, and photolithography is used to pattern the photoresist film. The patterned photoresist film is used as an etching mask, and as shown in FIG. 21, dry etching is used to selectively remove the interlayer insulating film 12 and gate insulating film 10 so as to remain on the gate embedded electrode 11 in order to open a source-contact hole. Although not shown in the drawing, a gate-contact hole is also opened in the interlayer insulating film 12 and gate insulating film 10 in a location differing from the source-contact hole so as to expose a portion of the gate surface electrode connected to the gate embedded electrode 11. Thereafter, the photoresist film is removed through wet processing or the like.

Next, sputtering or vapor deposition etc. is used to deposit a metal layer such as a Ni film, photolithography and RIE or the like are used to pattern the metal layer, and RTA (rapid thermal annealing) is used to perform heat treatment at 1000° C., for example, in order to form source contact layers 13a, 13b. Next, a metal layer such as a TiN film is deposited via sputtering or the like, and photolithography and RIE etc. are used to pattern the metal layer to form the bottom barrier metal layer 14. Next, metal layers such as Ti/Tin/Ti/Al films are continuously deposited via sputtering or the like. Photolithography and RIE etc. are used to pattern the metal layers such as the Ti/TiN/Ti/Al films, thus forming source electrode 16 and gate surface electrode (not shown) patterns that include the top barrier metal layer 15 on the bottom.

This results in the patterns of the source electrode 16 and gate surface electrode separating. Next, sputtering or vapor deposition etc. is used to form the drain electrode 17 made of Au or the like on the entire bottom surface of the drain region 1, as shown in FIG. 1. This completes the semiconductor device according to Embodiment 1 of the present invention.

Figure 22:
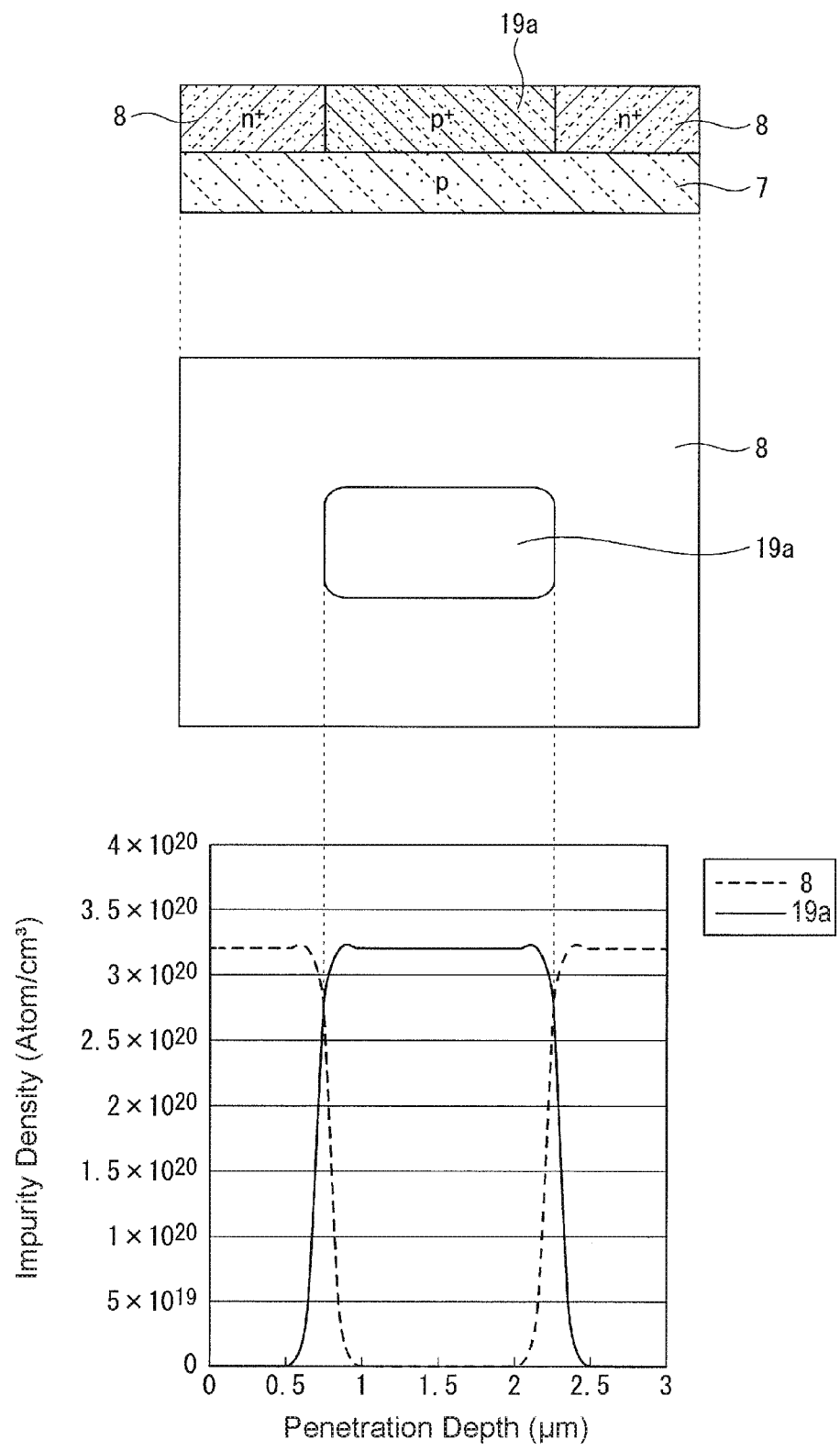
FIG. 22 is a view schematically describing an impurity density profile of a source region and base contact region in a semiconductor device that does not have gaps.
Figure 23:
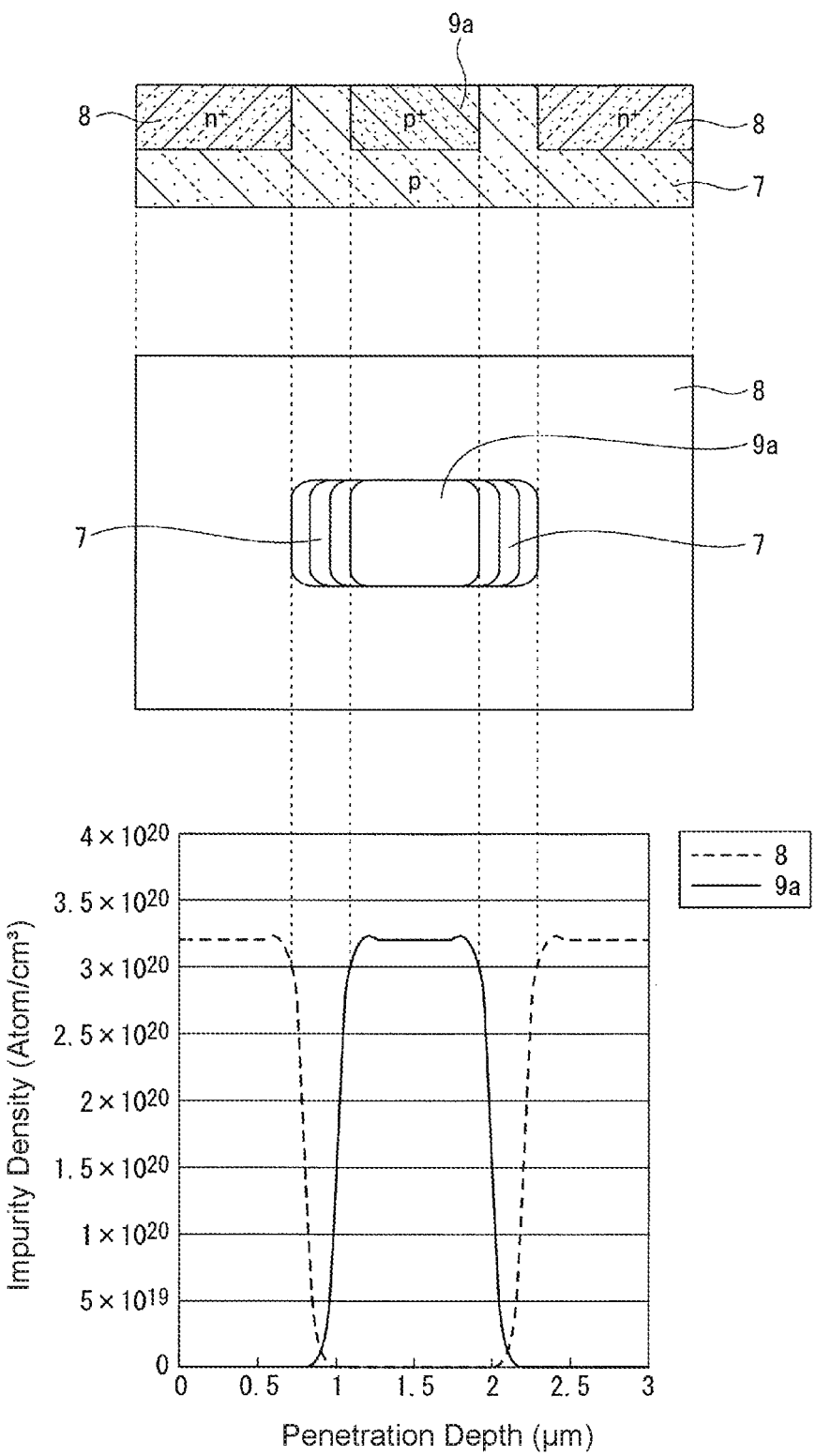
FIG. 23 is a view schematically describing an impurity density profile of a source region and base contact region in the semiconductor device of Embodiment 1 that has gaps.

In the plan view in the center of FIG. 22 and the plan view in the center of FIG. 23, positions with the same impurity density are shown connected by a line like a contour. The corresponding positions between the center plan view and the top cross-sectional view and the bottom graph diagram sandwiching the center plan view are respectively shown by dashed lines. If the first gap is not provided, then as shown in FIG. 22, the p⁺ base contact region 19a and the n⁺ source region 8 would each be formed with an impurity density of at least around $3 \times 10^{20}$ on the inner side and outer side of the boundary line.

On the other hand, as shown in FIG. 23, in Embodiment 1 in which the first gap is provided, the p-type base region 7 having a low impurity density is exposed at the first gap between the p⁺ base contact region 9a and n⁺ source region 8, which both have an impurity density of at least around $3 \times 10^{20}$. In FIG. 23, the impurity density of the base region 7 is not displayed based on the vertical axis scale, but is around $1 \times 10^{17}$, which is the lowest in the gap.

According to the method of manufacturing the semiconductor device according to Embodiment 1, the ion implantation mask 31 during the formation of the base contact region 9a is configured to protrude above the edge of the first planned region 8p into which n-type ion impurity ions have been implanted in advance and which will serve as the source region 8. The width of the opening in the ion implantation mask 31 is controlled to be narrower than the width w8p of the opening of the first planned region 8p. This protrusion part provides the first gaps having width wg that is at least the positional deviation width Δx in the <11-20> direction of the alignment mark between the base contact region 9a and source region 8 after activation. Due to the p-type impurity ions being implanted via the ion implantation mask 31, the second planned region 9ap serving as the base contact region 9a is formed small so that the base contact region 9a remains inside the surrounding opening after activation.

Due to this, even if a reading error of the alignment mark occurs and the second planed region 9ap is formed deviated from the initial design position by an amount equivalent to the positional deviation width Δx of the alignment mark, it is possible to reliably prevent overlapping of the base contact region 9a and source region 8 after activation. Changes will not occur to the forward voltage Vf and ON resistance Ron due to positional deviation of the base contact region 9a, and thus it is possible to stabilize and reduce variation in the forward voltage Vf and ON resistance Ron.

Furthermore, the method of manufacturing the semiconductor device according to Embodiment 1 makes it possible to continually use the initial alignment mark 104 formed on the semiconductor substrate without it being necessary to repeatedly form alignment marks. Accordingly, it is possible to use the same alignment mark and reduce the number of layers used in the photolithography process, thus making it possible to simplify the process.

The positional deviation width Δx may be set adding a fluctuation width caused by the positioning device that positions the semiconductor device. As a rule of thumb, the fluctuation width is preferably around 0.2 μm. For example, if the positional deviation width Δx caused by the off-angle θ and epitaxial growth is around 0.112 μm, it is possible to even more reliably prevent overlapping caused by positional deviation if the positional deviation width Δx is set at a value of around 0.312 μm, to which a value of around 0.2 μm has further been added, as the fluctuation width and if the width of the first gap is set to a value that is at least this positional deviation width Δx.

Embodiment 2

<Structure of Semiconductor Device>

Figure 24:
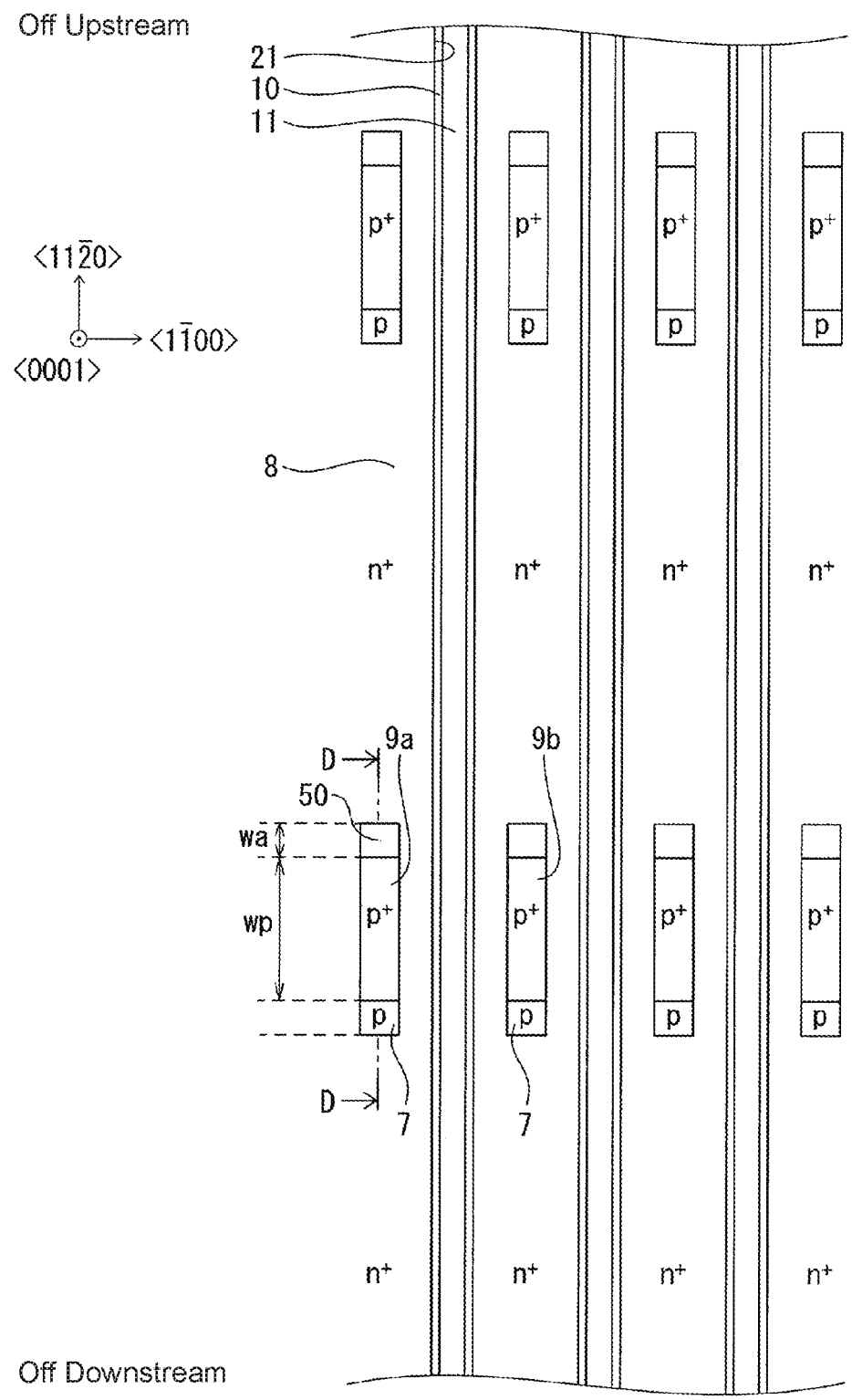
FIG. 24 is a plan view schematically showing an overview of the structure of a semiconductor device according to Embodiment 2 while leaving out regions above the SiC semiconductor layers.
Figure 25:
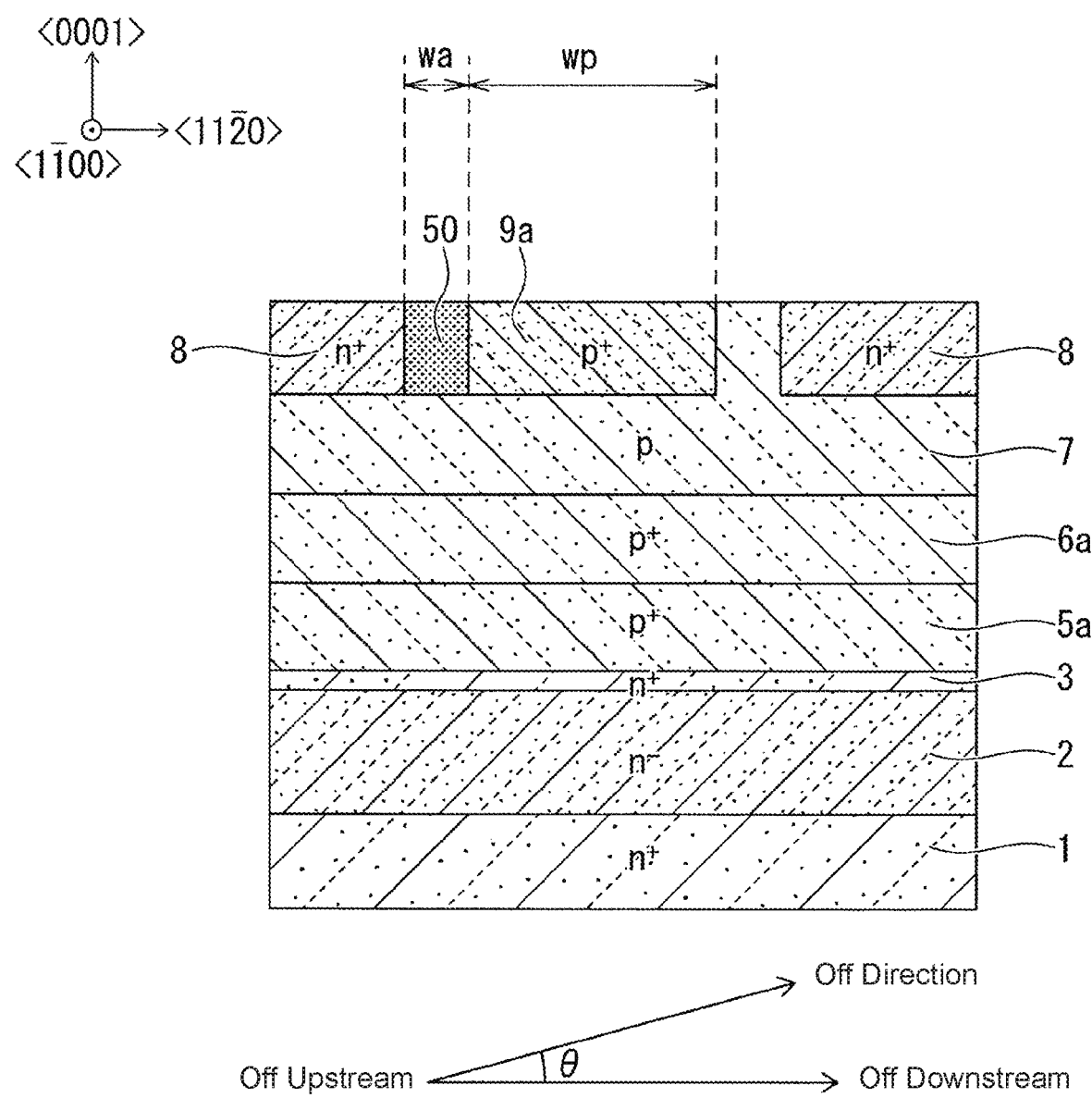
FIG. 25 is a cross-sectional view of main components as seen from a direction along the D-D line in FIG. 24.

As shown in FIG. 24, the semiconductor device according to Embodiment 2 has a first gap provided on end on the bottom side of the base contact region 9a in the <11-20> direction. Furthermore, a non-contact region 50 is further provided on the side opposite to the first gap, which is the top side of the base contact region 9a in the <11-20> direction. The non-contact region 50 has a lower impurity density than both the base contact region 9a and source region 8. The base contact region 9a has a width wp in the <11-20> direction, and the non-contact region 50 has a width wa in the <11-20> direction. The width of the non-contact region 50 in the <11-20> direction is approximately the same as the width of the base contact region 9a. As shown in FIG. 25, the top surface of the base region 7 is exposed at the first gap.

Figure 26:
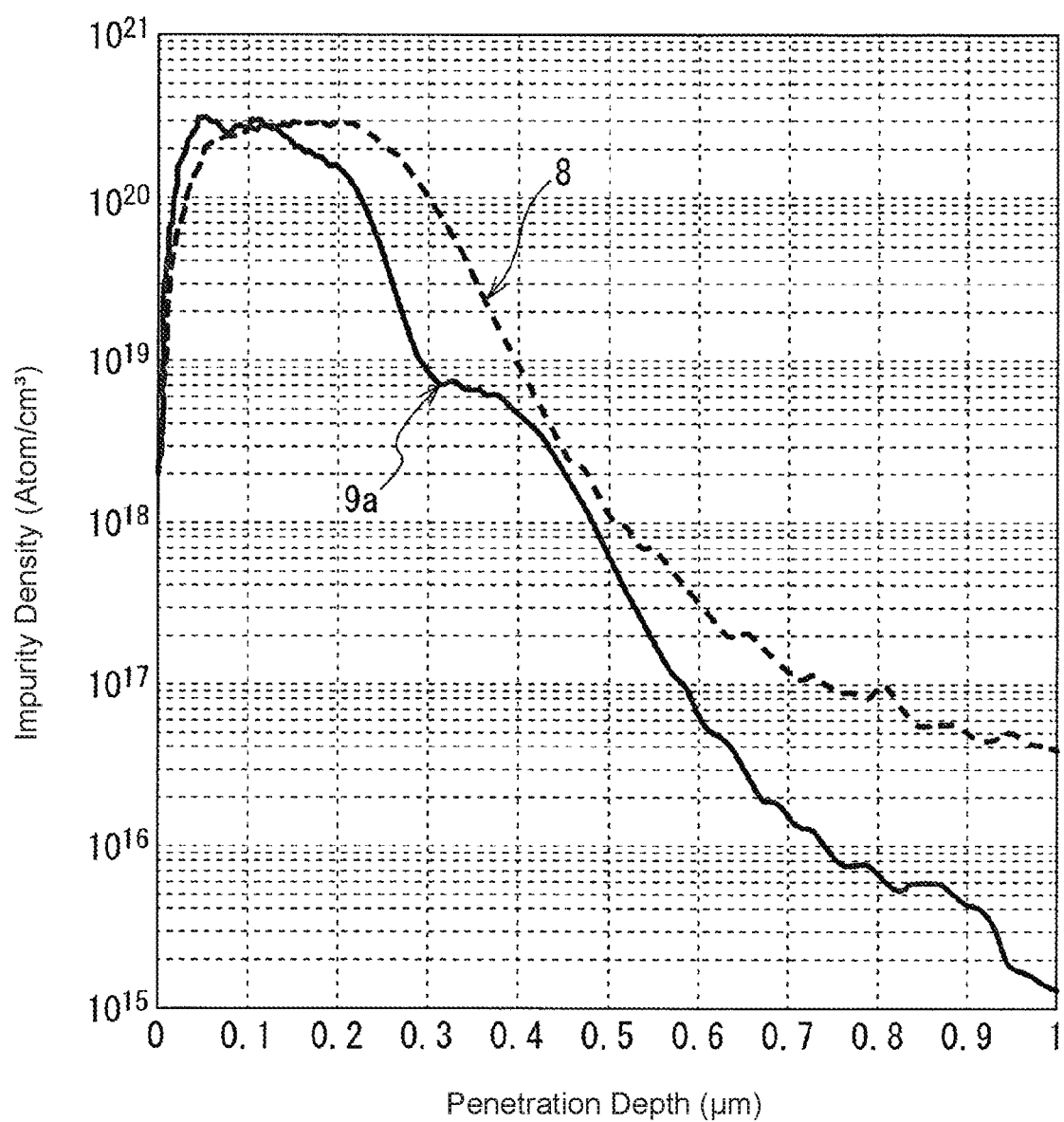
FIG. 26 is a graph diagram schematically describing an impurity density profile of a source region and base contact region in the semiconductor device of Embodiment 2.

As shown in FIG. 26, the impurity density of the source region 8 in SiC and the impurity density of the base contact region 9a are approximately the same or close to each other in the space from the surface to a depth of approximately 1.0 μm. Due to this, in the non-contact region 50 in which the source region 8 and base contact region 9a overlap each other, sufficient contact cannot be made. The relationship between the impurity density and penetration depth shown in FIG. 26 is similar for the semiconductor device according to Embodiment 1.

In Embodiment 2, the width wp of the base contact region 9a is set such that the sum of the width wp of the base contact region 9a and the width wa of the non-contact region 50 is greater than the positional deviation width Δx caused by the off-angle θ and epitaxial growth. The other configurations of the semiconductor device according to Embodiment 2 are equivalent to the respective members of the same name in the semiconductor device according to Embodiment 1, and thus overlapping descriptions will be omitted.

<Method of Manufacturing Semiconductor Device>

In the method of manufacturing the semiconductor device according to Embodiment 2, the process is similar to Embodiment 1 up to the step for forming the base region 7 on the top side of the drain region 1, which was described using FIGS. 11 to 13 in the method for manufacturing according to Embodiment 1. However, in Embodiment 2, the step for forming the n-type first planned region 8p that will become the source region 8 in the upper part of the base region 7 is executed by controlling the implantation width of the n-type impurity ions such that the width of the opening in the <11-20> direction of the source region 8 after activation is greater than the positional deviation width Δx. Furthermore, the aspect where the second planned region 9ap that will serve as the base contact region 9a and that has an opening of the same width as the opening in the first planned region 8p is formed differs from Embodiment 1.

If the position of the alignment mark read directly before forming the first planned region 8p and the position of the alignment mark read directly before forming the second planned region 9ap thereafter are the same, then the first planned region 8p and the second planned region 9ap will not overlap and defects will not occur. A method of manufacturing a semiconductor device in a case where a reading error has occurred and positional deviation of the alignment mark has occurred will be specifically described below.

Figure 27:
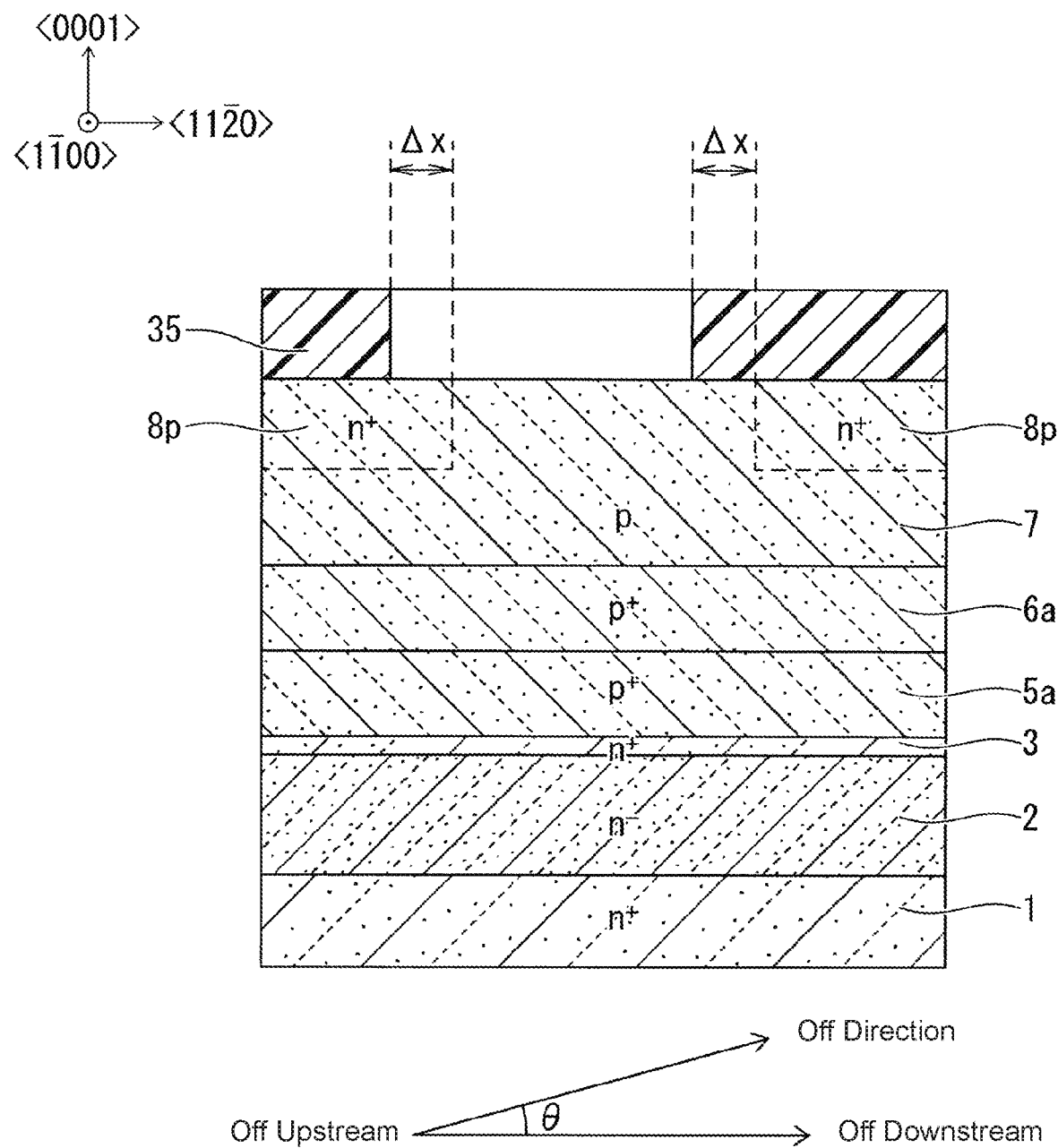
FIG. 27 is a cross-sectional view of a step schematically showing an overview of a method of manufacturing the semiconductor device according to Embodiment 2 in a case where a reading error of an alignment mark has occurred.
Figure 28:
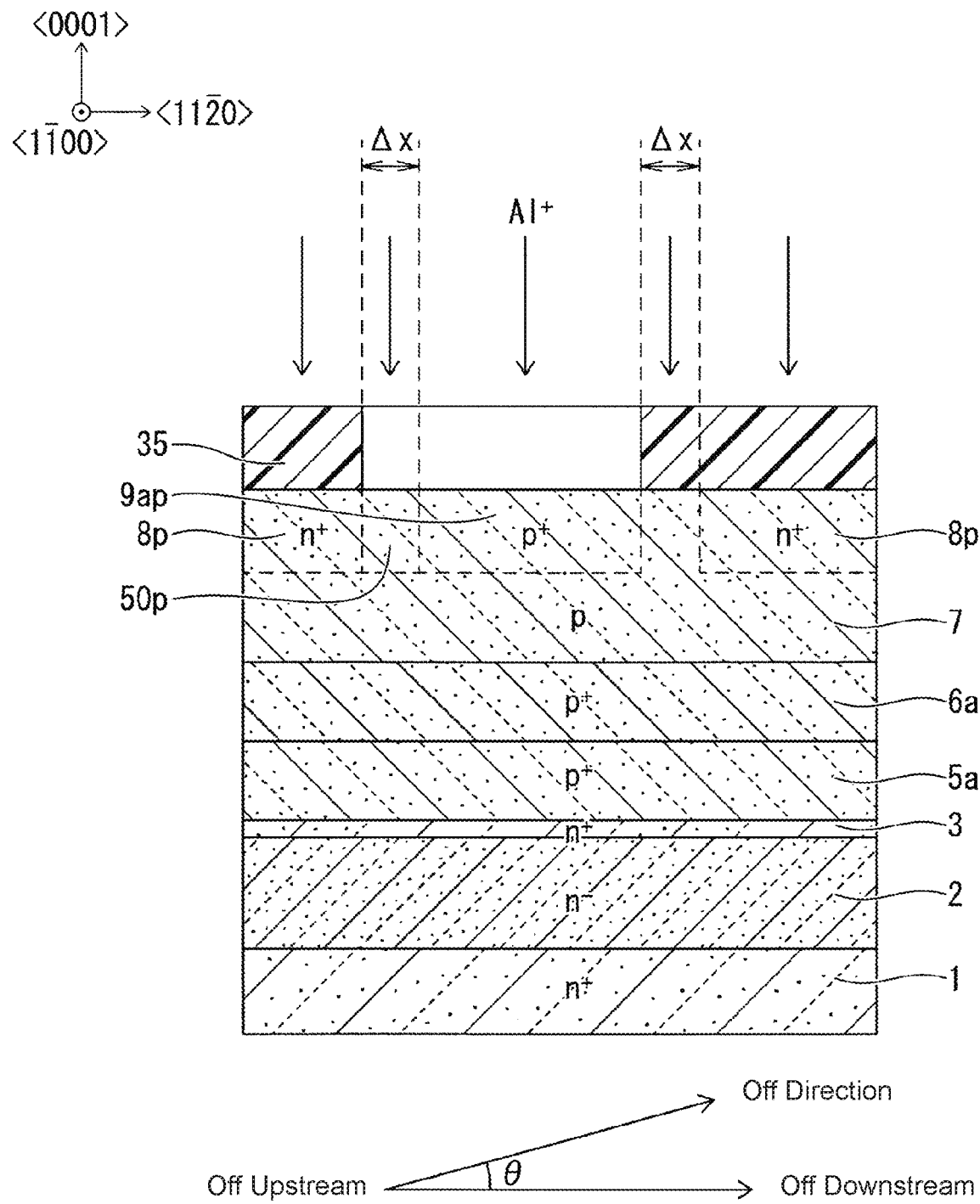
FIG. 28 is a cross-sectional view of a step, after the step in FIG. 27, schematically showing an overview of the method of manufacturing the semiconductor device.

As shown in FIG. 27, if a reading error of the alignment mark occurs, the opening in the ion implantation mask 35 formed on the base contact region 7 and first planned region 8p is formed having a positional deviation width Δx relative to the opening in the first planned region 8p underneath. The width of the opening in the first planned region 8p is the same width as the width of the opening in the ion implantation mask 35. As shown in FIG. 28, p-type impurity ions such as Al are ion implanted into the top surface of the base region 7 exposed from the opening and toward a portion of the top surface of the right end of the left-side first planned region 8p. The ion implantation forms the p-type second planned region 9ap in the upper part of the base region 7, and forms a third planned region 50p that will serve as the non-contact region 50 on the right end of the left-side first planned region 8p in FIG. 27. In the third planned region 50p, the p-type and n-type conductivity types cancel each other out, and the impurity density becomes very low.

In Embodiment 2, when forming the first planned region 8p, the n-type impurity ions are implanted by controlling the implantation width such that the width of the opening in the <11-20> direction of the source region 8 after activation is greater than the positional deviation width Δx. Due to this, even if a portion of the p-type impurity ions are overlappingly implanted into the left-side first planned region 8p, it is always possible to form the high-concentration p-type second planned region 9ap between the right-side first planned region 8p where overlapping implantation has not occurred and the low impurity density third planned region 50p. Accordingly, if a heat treatment is performed thereafter, the base contact region 9a can be reliably formed on the inner side of the opening in the source region 8. The semiconductor device according to Embodiment 2 is completed by performing the subsequent steps similarly to the steps in the manufacturing method in Embodiment 1 described using FIGS. 20 and 21.

Comparative Example

Figure 29:
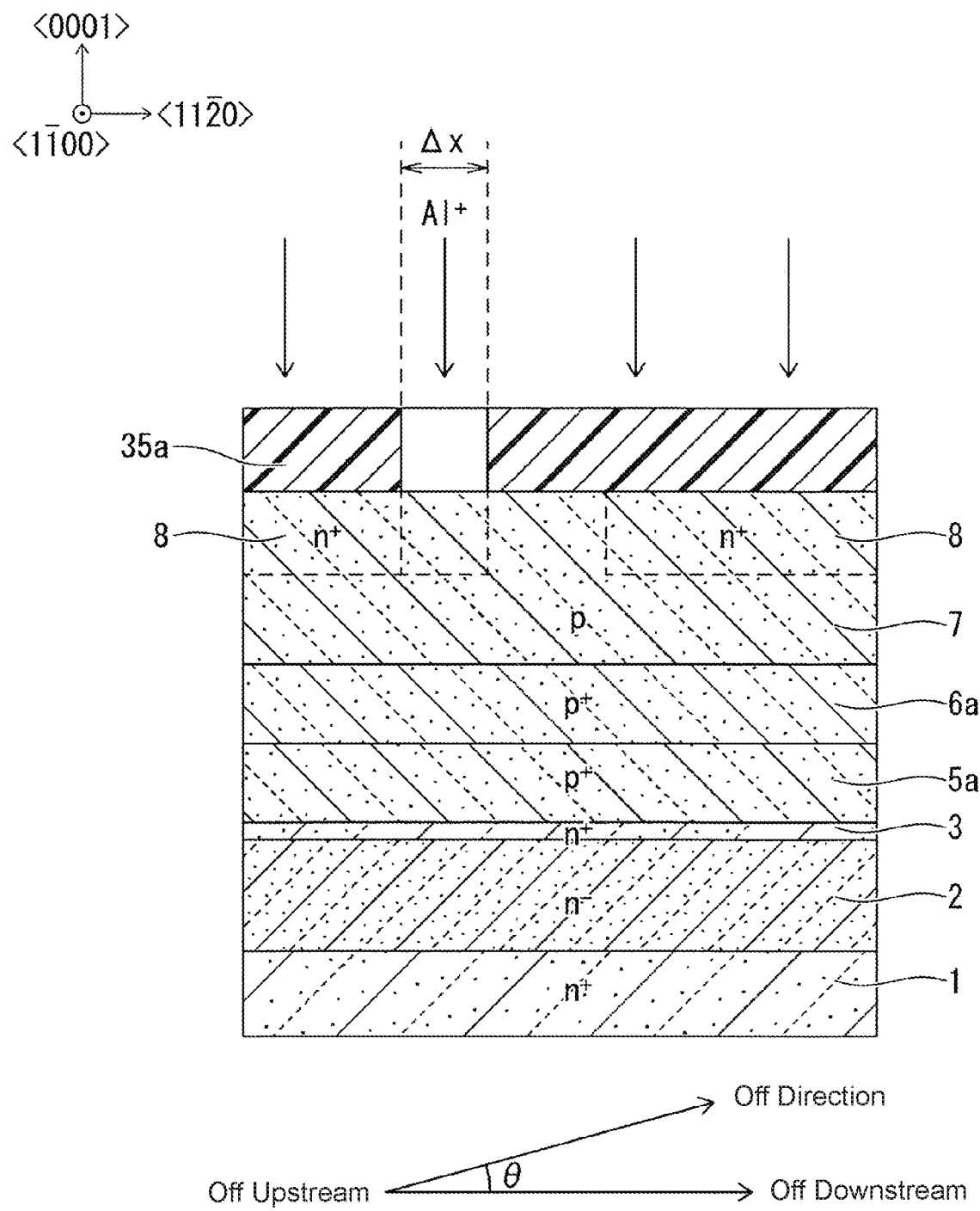
FIG. 29 is a cross-sectional view of a step schematically showing an overview of a method of manufacturing a semiconductor device according to a comparative example in a case where a reading error of an alignment mark has occurred.
Figure 30:
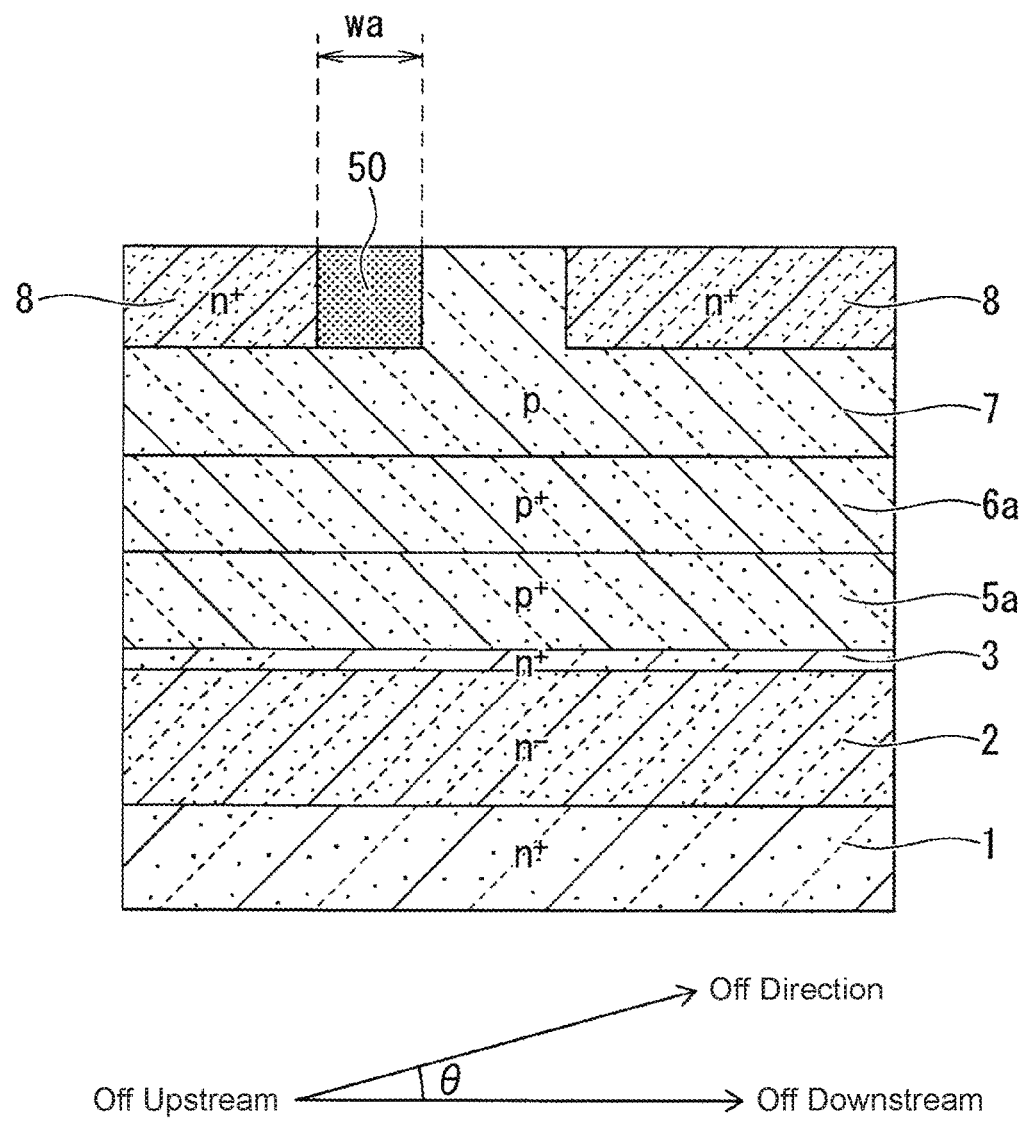
FIG. 30 is a cross-sectional view of a step, after the step in FIG. 29, schematically showing an overview of the method of manufacturing the semiconductor device.

Meanwhile, if the width of the opening in the <11-20> direction of the source region 8 after activation is the positional deviation width Δx or below, there is no guarantee of the forming of the base contact region 9a. FIG. 29 illustratively shows a case in which the implantation width of the n-type impurity ions is the same as the positional deviation width Δx. In the comparative example, the p-type impurity ions are all overlappingly implanted into the first planned region 8p. Due to this, as shown in FIG. 30, after activation only a non-contact region 50 of a width wa is formed in the portion interposed between the adjacent source regions 8, and a base contact region is not formed.

In Embodiment 2, the first planned region 8p is patterned and formed such that the width of the opening in the source region 8 after activation is greater than the positional deviation width Δx of the alignment mark. Furthermore, an ion implantation mask 35a for forming the base contact region 9a is patterned to form an opening aligned with the width of the opening in the source region, and p-type impurity ions are implanted via the ion implantation mask 35a having the opening to form the second planned region 9ap. Even if the second planned region 9ap is formed with a positional deviation relative to the opening of the first planned region 8p, it is possible to reliably form the base contact region 9a on the inner side of the opening in the source region 8 after activation. Due to this, even if a reading error of the alignment mark occurs, changes will not occur to the forward voltage Vf and ON resistance Ron due to positional deviation of the base contact region 9a, and thus it is possible to stabilize and reduce variation in forward voltage Vf and ON resistance Ron. The other effects of Embodiment 2 are similar to Embodiment 1.

Modification Example

Figure 31:
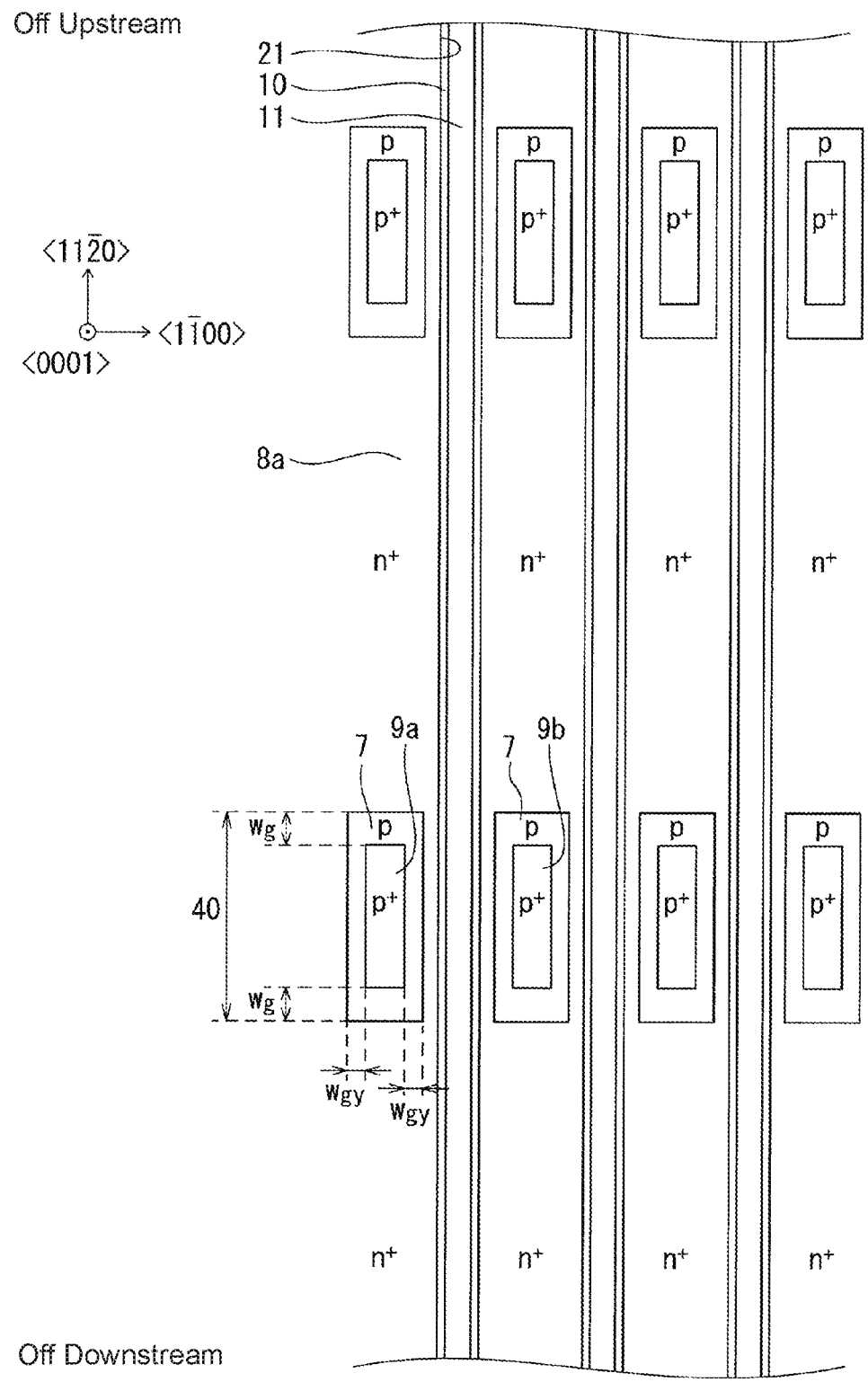
FIG. 31 is a plan view schematically showing an overview of the structure of the semiconductor device according to a modification example while leaving out regions above the SiC semiconductor layers.

As shown in FIG. 31, the present embodiment is provided with second gaps along the <1-100> direction in addition to the first gaps along the <11-20> direction. FIG. 31 illustratively shows, in addition to the first gaps described in Embodiment 1, second gaps having a width wgy provided between the base contact region 9a and source region 8 along the <1-100> direction. The second gaps are provided to both the left and right of the base contact regions 9a, 9b in FIG. 31.

In a similar manner to the first gaps, the second gaps formed along the <1-100> direction absorb a positional deviation width Δx in the <1-100> direction of the alignment mark caused by the off-angle θ and epitaxial growth and a fluctuation width in the <1-100> direction caused by the positioning device. Providing the second gaps also makes it possible to reduce overlapping of the base contact region 9a and source region 8 in the <1-100> direction. FIG. 31 illustratively shows a case where the second gaps along the <1-100> direction are combined with the configuration of the first gaps along the <11-20> direction described in Embodiment 1. However, the present invention is not limited to this, and the second gaps can also be combined with the configuration of Embodiment 2 where the non-contact region 50 is formed.

Other Embodiments

The present invention was described by the embodiment disclosed above, but the description and drawings that form a part of the disclosure should not be construed as limiting the present invention. Various substitute embodiments, working examples, and uses shall be clear to a person skilled in the art from the present disclosure.

For example, although embodiments described above have the lower or lowest alignment mark 104 in the top surface of the substrate (drain region) 1, the lowest or lower alignment mark from which an upper alignment mark is transferred may be formed in a top surface of the drift layer 2 or in any layer located under the base region 7. In such a case, there is no alignment mark on the substrate 1 and a drift layer is epitaxially grown on the entire surface of the substrate 1 without use of an alignment mark.

Moreover, in Embodiment 1, the width of the base contact region 9a was expressed as being made narrower than the width of the opening in the source region 8. However, presuming that the base contact region has a desired width in advance, the present invention is still realized even in a case where the dimensions of the opening in the source region 8 are set such that a gap that is at least the positional deviation width Δx of the alignment mark is formed around this base contact region. In a similar manner, in Embodiment 2, the width of the opening in the source region 8 was described with an expression that the width of the opening in the source region 8 is configured so as to be greater than the positional deviation width Δx of the alignment mark, but the present invention is still realized even if the "width of the opening in the source region" and "width of the base contact region" are switched. In other words, the region of focus may be changed, and the dimensions of the region after such change may be set in accordance with the positional deviation width Δx of the alignment mark.

Furthermore, the two first gaps shown in FIG. 2, for example, were both the same width wg, but may be mutually differing widths, and similarly, the two second gaps shown in FIG. 31 may also be mutually differing widths. As described above, the present invention includes various embodiments etc. not disclosed above, and the technical scope of the present invention is determined solely by the invention-defining matters within a reasonable scope of the claims from the descriptions above.

Furthermore, it will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a planar substrate made of silicon carbide single crystal, a <1-100> direction of the silicon carbide single crystal being in parallel with a plane of a top surface of the substrate, a <11-20> direction of the silicon carbide single crystal being offset by a non-zero off-angle θ relative to the plane of the top surface of the substrate, the substrate being of a first conductive type so as to serve as a lower electrode contact region for the semiconductor device;
   a drift layer made of silicon carbide single crystal of the first conductivity type, formed on the top surface of the substrate;
   a base region made of silicon carbide single crystal of a second conductivity type formed over the drift layer;
   an upper electrode contact region of the first conductivity type with a higher impurity density than the drift layer, selectively embedded in an upper part of the base region, the upper electrode contact region defining an opening in which the upper part of the base region remains in a plan view;
   a base contact region of the second conductivity type with a higher impurity density than the base region, selectively embedded in the opening of the upper electrode contact region in the upper part of the base region, the base contact region being formed in either one of the following manners:
      a) gaps are formed between the base contact region and respective edges, on both sides along the <11-20> direction, of the opening of the upper electrode contact region in the plan view, or
      b) a gap is formed between the base contact region and an edge, on only one side along the <11-20> direction, of the opening of the upper electrode contact region in the plan view, and a non-contact region is embedded in the upper part of the base region continuously from the base contact region in the opening on another side of the opening; and
   a gate electrode provided via a gate insulating film contacting the base region located between the upper electrode contact region and the drift layer, wherein at least one of the drift layer and the base region is epitaxially gown over the substrate, and a top surface of the upper part of the base region has an alignment mark that is transferred from a lower alignment mark formed in a top surface of a layer located below the base region, the alignment mark in the top surface of the base region having a positional deviation Δx relative to the lower alignment mark formed along the <11-20> direction in the plan view, and wherein in case of (a), a width, along the <11-20> direction, of a larger one of the gaps is greater than Δx, and in case of (b), a width, along the <11-20> direction, of the opening is greater than Δx, and a sum of a width, along the <11-20> direction, of the non-contact region and a width, along the <11-20> direction, of the base contact region is greater than Δx.

2. The semiconductor device according to claim 1, wherein Δx satisfies: Δx=t×tan θ, where t is a sum of thicknesses of all of epitaxially grown layers between the lower alignment mark and the alignment mark in the top surface of the upper part of the base region.

3. The semiconductor device according to claim 1, wherein both the drift layer and the base region epitaxially grown.

4. The semiconductor device according to claim 1, wherein the semiconductor device is a trench gate type in which a plurality of trenches extend in stripe shapes in the plan view along the <11-20> direction.

5. The semiconductor device according to claim 4, wherein a crystal plane of side walls of the trenches is a (11-20) a-plane or a (1-100) m-plane.

6. The semiconductor device according to claim 1, wherein the positional deviation Δx is 0.112 μm.

7. The semiconductor device according to claim 1, wherein in case of (a), the width, along the <11-20> direction, of the larger one of the gaps is greater than Δx+d, and in case of (b), the width, along the <11-20> direction, of the opening is greater than Δx+d, and the sum of the width, along the <11-20> direction, of the non-contact region and the width, along the <11-20> direction, of the base contact region is greater than Δx+d, where Δx satisfies: Δx=t×tan θ+d, where t is a sum of thicknesses of all of epitaxially grown layers between the lower alignment mark and the alignment mark in the top surface of the upper part of the base region, and d represents a statistically derived positional deviation due to an alignment error by a positioning device that positions the semiconductor device in photolithography.

8. The semiconductor device according to claim 7, wherein the positional deviation d is 0.2 μm.

9. The semiconductor device according to claim 3, wherein in case of (a), the width, along the <11-20> direction, of the larger one of the gaps is greater than Δx+d, and in case of (b), the width, along the <11-20> direction, of the opening is greater than Δx+d, and the sum of the width, along the <11-20> direction, of the non-contact region and the width, along the <11-20> direction, of the base contact region is greater than Δx+d, where Δx satisfies: Δx=t×tan θ+d, where t is a sum of thicknesses of all of epitaxially grown layers between the lower alignment mark and the alignment mark in the top surface of the upper part of the base region, and d represents a statistically derived positional deviation due to an alignment error by a positioning device that positions the semiconductor device in photolithography.

10. The semiconductor device according to claim 1, wherein the base contact region is formed in (b), and gaps are additionally formed between the base contact region and respective edges, on both sides along the <1-100> direction, of the opening of the upper electrode contact region in the plan view.

11. The semiconductor device according to claim 1, wherein the lower alignment mark is formed in a top surface of the drift layer, and the base region is epitaxially grown.

12. The semiconductor device according to claim 1, wherein the lower alignment mark is formed in the top surface of the substrate.

13. A method of manufacturing a semiconductor device, the method comprising:

preparing a semiconductor substrate made of silicon carbide single crystal, a <1-100> direction of the silicon carbide single crystal being in parallel with a plane of the top surface of the substrate, a <11-20> direction of the silicon carbide single crystal being offset by a non-zero off-angle θ relative to the plane of the top surface of the substrate, the substrate being of a first conductive type so as to serve as a lower electrode contact region for the semiconductor device;

forming a drift layer made of silicon carbide single crystal of the first conductivity type on the semiconductor substrate;

forming a base region made of silicon carbide single crystal of a second conductivity type over the drift layer;

selectively forming, in an upper part of the base region, a first doped region that will become an upper electrode contact region of the semiconductor device by implanting impurity ions of the first conductivity type with a higher impurity density than an impurity density of the drift layer such that the first doped region defines an opening that leaves the upper part of the base region not implanted with the impurity ions;

forming, on the first doped region, an ion implantation mask having an opening that exposes a surface of the opening of the first doped region in the upper part of the base region such that respective edges of the opening of the ion implantation mask along the <11-20> direction in a plan view protrude laterally and inwardly beyond respective inner edges of the opening of the first doped region, thereby covering the respective inner edges of the opening of the first doped region;

forming a second doped region that will become a base contact region by implanting impurity ions of the second conductivity type in the upper part of the base region through the ion implantation mask;

activating the first doped region to form the upper electrode contact region having an opening corresponding to the opening of the first doped region;

activating the second doped region to form the base contact region, the resulting base contact region being thereby formed in the opening of the upper electrode contact region;

forming a gate insulating film contacting the base region located between the upper electrode contact region and the drift layer; and forming a gate electrode on a surface of the gate insulating film, wherein at least one of the drift layer and the base region is formed by epitaxial growth, and the method further includes forming a lower alignment mark in a top surface of a layer that is located below the base layer and estimating a maximum alignment error, along the <11-20> direction, in positioning the ion implantation mask on the first doped region, the estimating of the maximum alignment error including estimating a lateral positional deviation Δx, along the <11-20> direction, of an alignment mark formed in a top surface of the base region that is transferred from the lower alignment mark, and wherein in the forming of the ion implantation mask, a width of an opening of the ion implantation mask along the <11-20> direction is set such that the resulting base contact region is always formed within the opening of the resulting upper electrode contact region along the <11-20> direction even when the estimated maximum alignment error is realized in positioning the ion implantation mask on the first doped region along the <11-20> direction.

14. A method of manufacturing a semiconductor device, the method comprising:

preparing a semiconductor substrate made of silicon carbide single crystal, a <1-100> direction of the silicon carbide single crystal being in parallel with a plane of the top surface of the substrate, a <11-20> direction of the silicon carbide single crystal being offset by a non-zero off-angle θ relative to the plane of the top surface of the substrate, the substrate being of a first conductive type so as to serve as a lower electrode contact region for the semiconductor device;

forming a drift layer made of silicon carbide single crystal of the first conductivity type on the semiconductor substrate;

forming a base region made of silicon carbide single crystal of a second conductivity type over the drift layer;

selectively forming, in an upper part of the base region, a first doped region that will become an upper electrode contact region of the semiconductor device by implanting impurity ions of the first conductivity type with a higher impurity density than an impurity density of the drift layer such that the first doped region defines an opening that leaves the upper part of the base region not implanted with the impurity ions;

forming an ion implantation mask on the first doped region, the ion implantation mask having an opening that has a same width as a width of the opening in the first doped region along the <11-20> direction;

forming a second doped region that will become a base contact region by implanting impurity ions of the second conductivity type in the upper part of the base region through the ion implantation mask;

activating the first doped region to form the upper electrode contact region;

activating the second doped region to form the base contact region;

forming a gate insulating film contacting the base region located between the upper electrode contact region and the drift layer; and forming a gate electrode on a surface of the gate insulating film, wherein at least one of the drift layer and the base region is formed by epitaxial growth, and the method further includes forming a lower alignment mark in a top surface of a layer located under the base region and estimating a maximum alignment error, along the <11-20> direction, in positioning the ion implantation mask on the first doped region, the estimating of the maximum alignment error including estimating a lateral positional deviation Δx, along the <11-20> direction, of an alignment mark formed in a top surface of the base region that is transferred from the lower alignment mark, and wherein in the forming of the first doped region, a width of the opening of the first doped region along the <11-20> direction is set such that a width of a corresponding opening of the resulting upper electrode contact region along the <11-20> direction is greater than the estimated maximum alignment error so that the base contact region is formed in at least a portion of the opening of the upper electrode contact region even when the estimated maximum alignment error is realized in positioning the ion implantation mask on the first doped region along the <11-20> direction.

15. The method according to claim 13, wherein the estimated maximum alignment error is Δx that is estimated by Δx=t×tan θ, where t is a sum of thicknesses of all of epitaxially grown layers between the lower alignment mark and the alignment mark in the top surface of the base region.

16. The method according to claim 14, wherein the estimated maximum alignment error is θx that is estimated by Δx=t×tan θ, where t is a sum of thicknesses of all of epitaxially grown layers between the lower alignment mark and the alignment mark in the top surface of the base region.

17. The method according to claim 13, wherein the maximum alignment error is estimated by Δx+d, where Δx is estimated by Δx=t×tan θ, t being a sum of thicknesses of all of epitaxially grown layers between the lower alignment mark and the alignment mark in the top surface of the base region, and d represents a statistically derived positional deviation due to an alignment error by a positioning device that positions the semiconductor device in photolithography.

18. The method according to claim 14, wherein the maximum alignment error is estimated by Δx+d, where Δx is estimated by Δx=t×tan θ, t being a sum of thicknesses of all of epitaxially grown layers between the lower alignment mark and the alignment mark in the top surface of the base region, and d represents a statistically derived positional deviation due to an alignment error by a positioning device that positions the semiconductor device in photolithography.

19. The method according to claim 13, wherein the lower alignment mark is formed in a top surface of the drift layer, and the base region is epitaxially grown.

20. The method according to claim 14, wherein the lower alignment mark is formed in a top surface of the drift layer, and the base region is epitaxially grown.

* * * * *

UNITED STATES PATENT AND TRADEMARK OFFICE
CERTIFICATE OF CORRECTION

PATENT NO.         : 10,686,066 B2
APPLICATION NO.    : 16/169868
DATED              : June 16, 2020
INVENTOR(S)        : Keiji Okumura Page 1 of 1

It is certified that error appears in the above-identified patent and that said Letters Patent is hereby corrected as shown below:

In the Claims

Column 24, Line 30, the text "θx" should be changed to -- Δx --.

Signed and Sealed this
Twenty-second Day of September, 2020

Andrei Iancu
*Director of the United States Patent and Trademark Office*